US009106224B2

(12) United States Patent
Umezaki

(10) Patent No.: US 9,106,224 B2
(45) Date of Patent: Aug. 11, 2015

(54) SEMICONDUCTOR DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/250,623

(22) Filed: Apr. 11, 2014

(65) Prior Publication Data

US 2014/0247070 A1 Sep. 4, 2014

(30) Foreign Application Priority Data

May 13, 2011 (JP) ................. 2011-108133

(51) Int. Cl.
*G05F 1/10* (2006.01)
*H03K 17/081* (2006.01)
*G09G 3/20* (2006.01)
*G11C 19/18* (2006.01)
*G11C 19/28* (2006.01)
*H03K 19/0185* (2006.01)

(52) U.S. Cl.
CPC ........... *H03K 17/08104* (2013.01); *G09G 3/20* (2013.01); *G11C 19/184* (2013.01); *G11C 19/28* (2013.01); *H03K 19/018521* (2013.01); *G09G 2310/0286* (2013.01); *G09G 2320/043* (2013.01); *G09G 2330/021* (2013.01)

(58) Field of Classification Search
USPC ................. 327/108–109, 538, 540–543, 424, 327/429–430
See application file for complete search history.

(56) References Cited

U.S. PATENT DOCUMENTS

| 6,774,663 | B2 | 8/2004 | Moreaux |
| 6,936,844 | B1 | 8/2005 | Yamazaki |
| 6,975,142 | B2 | 12/2005 | Azami |
| 7,368,896 | B2 | 5/2008 | Nagata |

(Continued)

FOREIGN PATENT DOCUMENTS

| JP | 2002-328643 A | 11/2002 |
| JP | 2008-009418 A | 1/2008 |

(Continued)

OTHER PUBLICATIONS

Chul-Kyu Kang et al.; "4.2: Integrated Scan Driver with Oxide TFTs Using Floating Gate Method"; SID Digest '11 : SID International Symposium Digest of Technical Papers; May 17, 2011; pp. 25-27.

*Primary Examiner* — An Luu
(74) *Attorney, Agent, or Firm* — Fish & Richardson P.C.

(57) ABSTRACT

Provided is a semiconductor device which can operate stably even in the case where a transistor thereof is a depletion transistor. The semiconductor device includes a first transistor for supplying a first potential to a first wiring, a second transistor for supplying a second potential to the first wiring, a third transistor for supplying a third potential at which the first transistor is turned on to a gate of the first transistor and stopping supplying the third potential, a fourth transistor for supplying the second potential to the gate of the first transistor, and a first circuit for generating a second signal obtained by offsetting a first signal. The second signal is input to a gate of the fourth transistor. The potential of a low level of the second signal is lower than the second potential.

14 Claims, 23 Drawing Sheets

(56) References Cited

U.S. PATENT DOCUMENTS

| | | |
|---|---|---|
| 7,411,318 B2 | 8/2008 | Kimura |
| 7,443,202 B2 | 10/2008 | Kimura |
| 7,586,478 B2 | 9/2009 | Azami |
| 7,656,373 B2 | 2/2010 | Hasegawa |
| 7,663,404 B2 | 2/2010 | Kimura |
| 7,903,079 B2 | 3/2011 | Azami |
| 7,961,006 B2 | 6/2011 | Kimura |
| 8,284,151 B2 | 10/2012 | Azami |
| 8,314,514 B2 | 11/2012 | Kimura |
| 8,471,596 B2 | 6/2013 | Kimura et al. |
| 8,698,356 B2 | 4/2014 | Kimura |
| 2006/0180840 A1 | 8/2006 | Nishimuta |
| 2011/0149189 A1 | 6/2011 | Azami |
| 2011/0233633 A1 | 9/2011 | Kimura |
| 2014/0299927 A1 | 10/2014 | Kimura |

FOREIGN PATENT DOCUMENTS

| | | |
|---|---|---|
| JP | 2009-017076 A | 1/2009 |
| JP | 2009-094927 A | 4/2009 |
| JP | 2010-063155 A | 3/2010 |

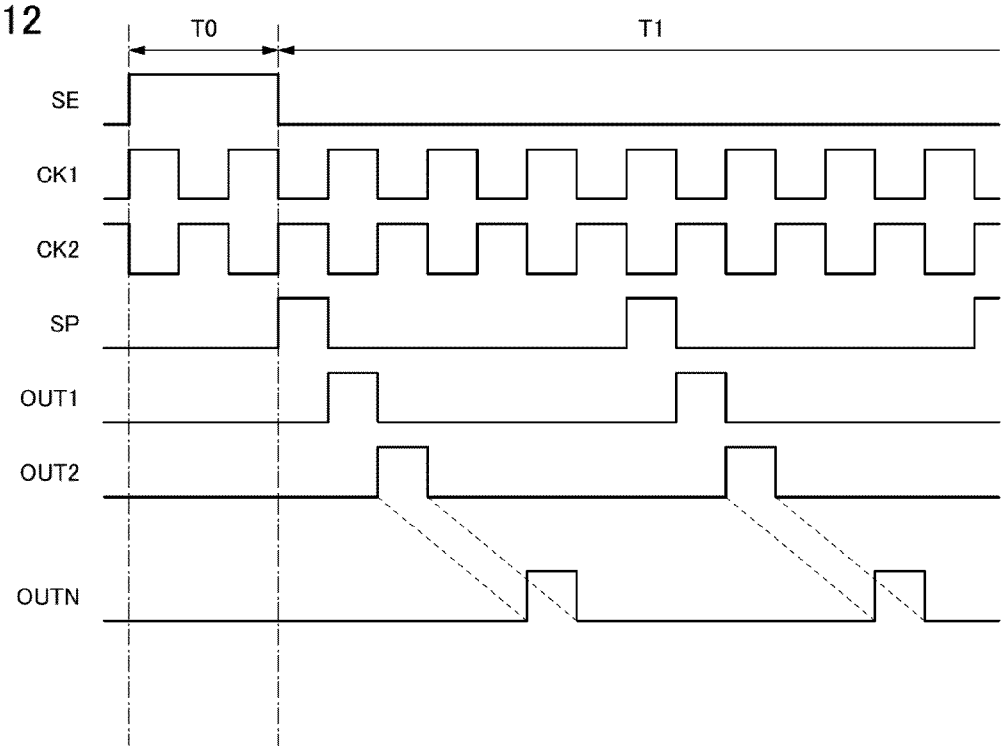

● In
☾ Sn
☽ Zn
● O

- In
- Ga
- Zn
- O

SEMICONDUCTOR DEVICE

CROSS-REFERENCE TO RELATED APPLICATIONS

This application is a continuation of U.S. application Ser. No. 13/468,135, filed May 10, 2012, now allowed, which claims the benefit of a foreign priority application filed in Japan as Serial No. 2011-108133 on May 13, 2011, both of which are incorporated by reference.

BACKGROUND OF THE INVENTION

1. Field of the Invention

One embodiment of the present invention relates to semiconductor devices and display devices.

2. Description of the Related Art

Display devices with higher value have been developed accompanying spread of large-sized display devices such as liquid crystal television. In particular, a technology of using transistors whose conductivity types are the same as each other in a driver circuit has been actively developed (see Patent Document 1).

FIG. 23 illustrates a driver circuit described in Patent Document 1. The driver circuit described in Patent Document 1 includes transistors M1, M2, M3, and M4 and a capacitor C1. In Patent Document 1, in the case where a signal at high level is output as a signal OUT, a gate of the transistor M1 is made into a floating gate, and a bootstrap operation in which the potential of the gate of the transistor M1 is increased to be higher than a potential VDD by using capacitive coupling of the capacitor C1. To make the gate of the transistor M1 into the floating gate, a transistor (e.g., the transistor M4) connected to the gate of the transistor M1 is turned on by making the potential difference between gate and source of the transistor (hereinafter, the difference is referred to as Vgs) 0 V.

Further, in the case where a signal at low level is output as the signal OUT, a signal at high level is input as a signal IN, and thus the transistors M2 and M3 are turned on.

REFERENCE

Patent Document 1: Japanese Published Patent Application No. 2002-328643

SUMMARY OF THE INVENTION

When a depletion transistor (also called a normally-on transistor) is used as the transistor, the transistor is not turned off at Vgs of 0 V. Therefore, in the case where the signal at high level is output as the signal OUT, the transistors M3 and M4 are not turned off, and thus the gate of the transistor M1 is not made into the floating gate. When the gate of the transistor M1 cannot be made into the floating state, the bootstrap operation cannot be performed normally, which may lead to malfunction or narrowing of the operating frequency range.

Further, in the case where the signal at low level is output as the signal OUT, since the driving voltage of the driver circuit of a display device is high, Vgs of the transistor M2 and the transistor M3 are also large, which promotes degradation of the transistors and may cause malfunction of the driver circuit.

In view of the above, one object of one embodiment of the present invention is to provide a semiconductor device which can operate stably even in the case where a transistor thereof is a depletion transistor. Further, one object of one embodiment of the present invention is to suppress degradation of a transistor.

A semiconductor device of one embodiment of the present invention includes a first transistor for supplying a first potential to a first wiring, a second transistor for supplying a second potential to the first wiring, a third transistor for supplying a third potential at which the first transistor is turned on to a gate of the first transistor and stopping supplying the third potential, a fourth transistor for supplying the second potential to the gate of the first transistor, and a first circuit for generating a second signal obtained by offsetting a first signal. The second signal is input to a gate of the fourth transistor. The potential of a low level of the second signal is lower than the second potential.

A semiconductor device of one embodiment of the present invention includes a first transistor for supplying a first potential to a first wiring, a second transistor for supplying a second potential to the first wiring, a third transistor for supplying a third potential at which the first transistor is turned on to a gate of the first transistor and stopping supplying the third potential, a fourth transistor for supplying the second potential to the gate of the first transistor, a capacitor whose one electrode is input with a first signal, and a fifth transistor for supplying a fourth potential to the other electrode of the capacitor. A gate of the fourth transistor is connected to the other electrode of the capacitor. The fourth potential is lower than the second potential.

The first signal may be input to a gate of the second transistor in the above-described semiconductor device.

According to one embodiment of the present invention, even in the case where a transistor is a depletion transistor, the transistor can be turned off. Further, the drain current of a transistor in the off-state can be decreased. Accordingly, malfunction of a circuit can be prevented. Further, according to one embodiment of the present invention, Vgs of a transistor can be decreased, whereby degradation of the transistor can be suppressed.

BRIEF DESCRIPTION OF THE DRAWINGS

FIG. 12 is a chart for illustrating a shift register according to one embodiment of the present invention;

DETAILED DESCRIPTION OF THE INVENTION

Examples of embodiments of the present invention are described with reference to the drawings below. Note that it will be readily appreciated by those skilled in the art that details of the embodiments can be modified in various ways without departing from the spirit and scope of the present invention. The present invention is therefore not limited to the following description of the embodiments.

Embodiment 1

In this embodiment, one example of a semiconductor device which is driven by a signal generated by offsetting an input signal is described.

Figure 1A:
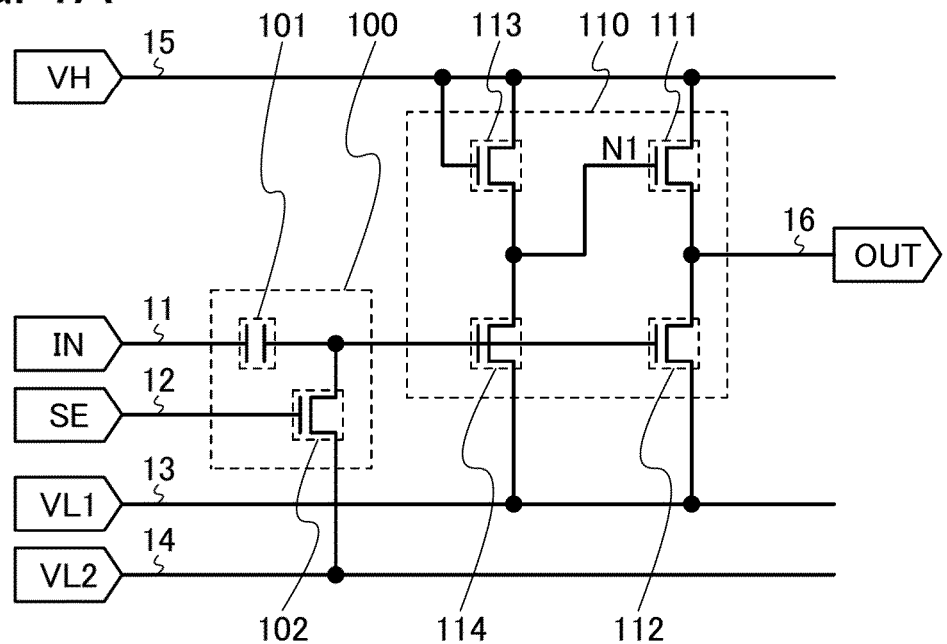
FIGS. 1A and 1B are diagrams for illustrating a semiconductor device according to one embodiment of the present invention.

A configuration of a semiconductor device of this embodiment is described with reference to FIG. 1A. FIG. 1A is a circuit diagram of the semiconductor device of this embodiment. The semiconductor device in FIG. 1A includes a circuit 100 and a circuit 110. The circuit 100 is connected to a wiring 11, a wiring 12, a wiring 14, and the circuit 110. The circuit 110 is connected to a wiring 15, a wiring 13, a wiring 16, and the circuit 100. The wirings and the like connected to any of the circuits 100 and 110 can be changed as appropriate depending on the configurations of the circuits 100 and 110.

Note that in this specification, the case where X and Y are electrically connected to each other, the case where X and Y are functionally connected to each other, and the case where X and Y are directly connected to each other are encompassed in the explicit description of "X is connected to Y".

Potential VL1 is supplied to the wiring 13. The potential VL1 is a predetermined potential. The wiring 13 transmits the potential VL1.

Potential VL2 is supplied to the wiring 14. The potential VL2 is a predetermined potential and is lower than the potential VL1. The wiring 14 transmits the potential VL2.

Potential VH is supplied to the wiring 15. The potential VH is a predetermined potential and is higher than the potential VL1. The wiring 15 transmits the potential VH.

The wirings 13, 14, and 15 are also called power supply lines. The potentials VL1, VL2, and VH are also called power supply potentials and each supplied from a power supply circuit or the like.

Signal IN is input to the wiring 11. The signal IN is an input signal of the semiconductor device. The signal IN is a digital signal whose high-level potential is VH and low-level potential is VL1. That is, either the potential VH or the potential VL1 is supplied to the wiring 11. The wiring 11 transmits the signal IN.

Signal SE is input to the wiring 12. The signal SE is a signal for controlling the timing at which an offset voltage is generated. The signal SE is a digital signal whose high-level potential is higher than VL2 and low-level potential is lower than or equal to VL2. That is, either the potential higher than the potential VL2 or the potential lower than or equal to the potential VL2 is supplied to the wiring 12. The wiring 12 transmits the signal SE.

Signal OUT is output from the wiring 16. The signal OUT is an output signal of the semiconductor device. The signal OUT is a digital signal whose high-level potential is VH and low-level potential is VL1. The wiring 16 transmits the signal OUT.

The wirings 11, 12, and 16 are also called signal lines. Further, the signal 1N, the signal SE, and the signal OUT are also called an input signal, a control signal, and an output signal, respectively.

The circuit 100 generates a signal INO by offsetting the signal IN. That is, the circuit 100 generates the signal INO which is less than the potential of the signal IN by the offset voltage. The circuit 100 outputs the signal INO to the circuit 110.

The low-level potential of the signal INO is lower than the potential VL1 of the wiring 13. On the other hand, the high-level potential of the signal INO is preferably higher than VL1 and lower than VH.

The circuit 110 selects the high level or the low level of the signal OUT in response to the signal INO (output signal of the circuit 100). For example, in the case where the circuit 110 is an inverter circuit, the circuit 110 outputs the low-level potential of the signal OUT when the signal INO is at the high level, whereas outputs the high-level potential of the signal OUT when the signal INO is at the low level. The circuit 110 selects which of the potential of the wiring 15 and the potential of the wiring 13 is output to the wiring 16, in response to the signal INO. For example, the circuit 110 outputs the potential of the wiring 13 to the wiring 16 when the signal INO is at the high level, whereas outputs the potential of the wiring 15 to the wiring 16 when the signal INO is at the low level. The circuit 110 also increases the high-level potential of the signal OUT to the potential VH of the wiring 15 by a bootstrap operation.

Next, a specific example of the circuit 100 and the circuit 110 is described with reference to FIG. 1A.

The circuit 100 includes a capacitor 101 and a transistor 102. One electrode of the capacitor 101 is connected to the wiring 11. A first terminal (one of a source and a drain) of the transistor 102 is connected to the wiring 14, a second terminal thereof is connected to the other electrode of the capacitor 101, and a gate thereof is connected to the wiring 12.

The circuit 110 includes transistors 111, 112, 113, and 114. A first terminal of the transistor 111 is connected to the wiring 15, and a second terminal thereof is connected to the wiring 16. A first terminal of the transistor 112 is connected to the wiring 13, a second terminal thereof is connected to the wiring 16, and a gate thereof is connected to a gate of the transistor 114. A first terminal of the transistor 113 is connected to the wiring 15, a second terminal thereof is connected to a gate of the transistor 111, and a gate thereof is connected to the wiring 15. A first terminal of the transistor 114 is connected to the wiring 13, a second terminal thereof is connected to the gate of the transistor 111, and the gate thereof is connected to the other electrode of the capacitor 101. A portion at which the gate of the transistor 111 is connected to another transistor (e.g. transistor 113, transistor 114) is denoted by a node N1.

The capacitor 101 holds a potential difference between the wiring 11 and the second terminal of the transistor 102. Thus, in the case where the second terminal of the transistor 102 is in the floating state, the potential of the second terminal of the transistor 102 varies in accordance with the signal input to the wiring 11, i.e., the potential of the signal INO varies in accordance with the signal IN.

The transistor 102 supplies the potential VL2 of the wiring 14 to the other electrode of the capacitor 101. The timing at which the transistor 102 supplies the potential VL2 to the other electrode of the capacitor 101 is controlled by the signal SE of the wiring 12.

The potential supplied to the other electrode of the capacitor 101 by the transistor 102 is lower than the potential VL1. Specifically, the transistor 102 supplies a potential lower than the potential of the first terminal of the transistor 114 to the other electrode of the capacitor 101.

The transistor 111 supplies the potential VH of the wiring 15 to the wiring 16. The transistor 111 also holds a potential difference between the gate and the second terminal of the transistor 111. Thus, in the case where the node N1 is in the floating state, the potential of the node N1 increases as the potential of the wiring 16 increases.

In the case where a signal is input to the wiring 15, the transistor 111 supplies the signal of the wiring 15 to the wiring 16.

The transistor 112 supplies the potential VL1 of the wiring 13 to the wiring 16. The timing at which the transistor 112 supplies the potential VL1 to the wiring 16 is controlled by the signal INO (potential of the other electrode of the capacitor 101) output from the circuit 100.

The transistor 113 supplies the potential VH of the wiring 15 to the gate of the transistor 111. After the potential VH is supplied to the gate of the transistor 111, the transistor 113 stops supplying the potential VH to the gate of the transistor 111. The transistor 113 keeps supplying the potential VH to the gate of the transistor 111 after the transistor 111 is turned on until the transistor 113 is turned off.

The potential supplied to the gate of the transistor 111 by the transistor 113 is a potential at which the transistor 111 is turned on.

The transistor 114 supplies the potential VL1 of the wiring 13 to the gate of the transistor 111. The timing at which the transistor 114 supplies the potential VL1 to the gate of the transistor 111 is controlled by the signal INO output from the circuit 100.

The conductivity types of the transistors included in the semiconductor device of this embodiment (e.g., transistors 102, 111, 112, 113, and 114) are the same as each other.

Description is made in this embodiment in the case where the transistors included in the semiconductor device of this embodiment are n-channel transistors.

Figure 1B:
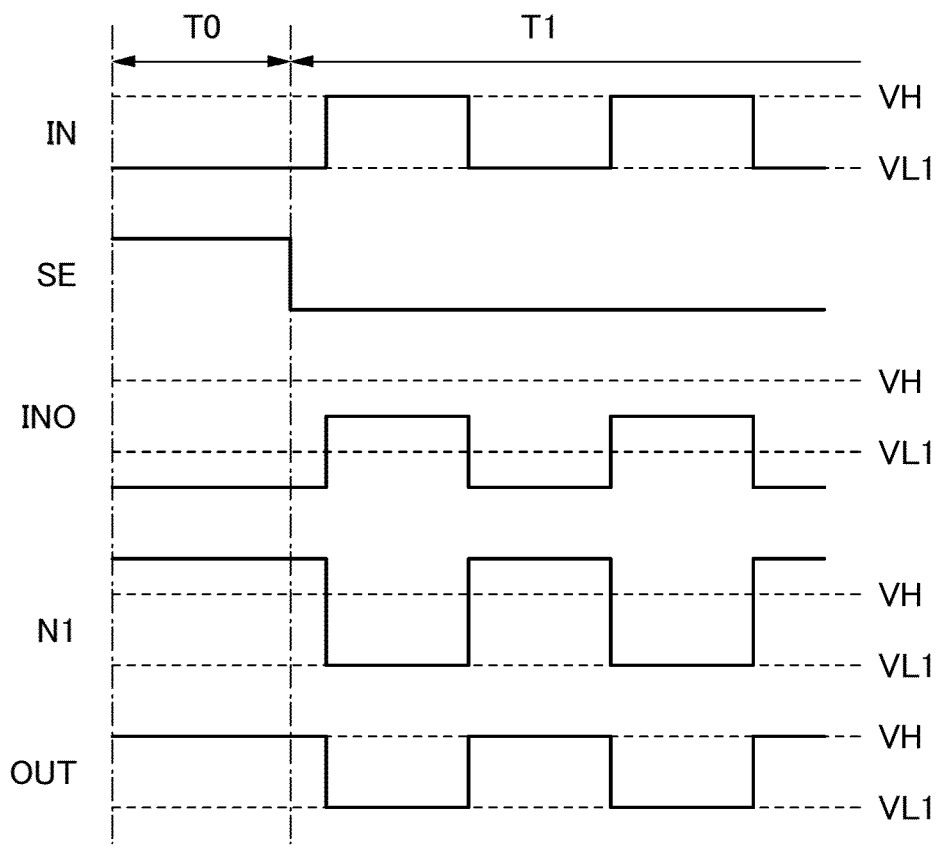

Next, an example of a driving method of the semiconductor device shown in FIG. 1A is described with reference to FIG. 1B. FIG. 1B is an example of a timing chart for describing the driving method of the semiconductor device shown in FIG. 1A.

A period is divided into a period T0 and a period T1 for description of the driving method of the semiconductor device shown in FIG. 1A.

The period T0 is a period for holding an offset voltage in the capacitor 101. First, the signal IN is set at a low level, so that the potential of the one electrode of the capacitor 101 becomes VL1. Further, the signal SE is set at a high level to turn on the transistor 102. Consequently, the potential VL2 of the wiring 14 is supplied to the other electrode of the capacitor 101, so that the potential of the other electrode of the capacitor 101 becomes VL2. In this manner, a difference between the low-level potential VL1 of the signal IN and the potential VL2 of the wiring 14 supplied through the transistor 102, i.e., the difference (VL1−VL2), is held in the capacitor 101. The difference (VL1−VL2) corresponds to the offset voltage.

In the period T0, a potential lower than VL1 is supplied to the other electrode of the capacitor 101 through the transistor 102.

The period T1 is a period for generating the signal INO by offsetting the signal IN and driving the circuit 110 by the signal INO. First, the signal SE is changed to a low level to turn off the transistor 102, whereby the other electrode of the capacitor 101 is made into a floating state. Since the capacitor 101 holds the potential difference (VL1−VL2) in the period T0, a signal obtained by subtracting the potential difference (VL1−VL2) from the potential of the signal IN is generated as the signal INO. Therefore, when the signal IN is at the low level, the signal INO becomes a low level whose potential is lower than VL1; when the signal IN is at the high level, the signal INO becomes a high level whose potential is lower than VH.

The driving method of the semiconductor device shown in FIG. 1A in the period T1 is described with the case where the signal IN is at the high level and the case where the signal IN is at the low level.

In the period T1, when the potential of the signal IN is changed to the high level, the signal INO becomes the high level, so that the transistors 112 and 114 are turned on. Consequently, the potential VL1 of the wiring 13 is supplied to the wiring 16 through the transistor 112. The potential VL1 of the wiring 13 is also supplied to the node N1 through the transistor 114. The potential VH of the wiring 15 is also supplied to the node N1 through the transistor 113. However, the potential of the node N1 becomes as low as a potential at which the transistor 111 is turned off, where the W (channel width)/L (channel length) ratio of the transistor 114 is sufficiently larger than that of the transistor 113; thus, the transistor 111 is turned off. Accordingly, the signal OUT becomes a low-level potential which is VL1.

On the other hand, in the period T1, when the level of the signal IN is changed to the low level, the signal INO becomes the low level, so that the transistors 112 and 114 are turned off. Since the potential VH of the wiring 15 is supplied to the node N1 through the transistor 113, the potential of the node N1 increases. Consequently, the transistor 111 is turned on, so that the potential VH of the wiring 15 is supplied to the wiring 16 through the transistor 111, thereby increasing the potential of the wiring 16. Then, the potential of the node N1 reaches a potential obtained by subtracting the threshold voltage of the transistor 113 from the potential VH, so that the transistor 113 is turned off to make the node N1 in a floating state. Even after the node N1 is made in the floating state, the potential of the wiring 16 increases. In addition, a potential difference between the node N1 and the wiring 16 at the time when the transistor 113 is turned off is held between the gate and the second terminal of the transistor 111. Therefore, the potential of the node N1 further increases to be higher than the potential VH along with the increase in the potential of the wiring 16. The above is a so-called bootstrap operation. Accordingly, the signal OUT becomes a high-level potential which is VH.

In the case where a signal is input to the wiring 15, the signal is output to the wiring 16. For example, in the case where a clock signal is input to the wiring 15, the clock signal is output to the wiring 16 from the wiring 15 in the period during which the signal IN is at the low level.

As described above, when the signal OUT is at the high level, the potential of the gate of the transistor 114 is lower than VL1, and thus Vgs of the transistor 114 is a negative value; therefore, even if the transistor 114 is a depletion transistor, the transistor 114 can be turned off, or even if the transistor 114 is a transistor whose drain current at Vgs of 0 V is large, the drain current of the transistor 114 can be suppressed. Accordingly, the gate of the transistor 111 can be made into the floating state, whereby malfunction of the circuit 110 can be prevented.

Further, like the transistor 114, Vgs of the transistor 112 is also a negative value. Therefore, even if the transistor 112 is a depletion transistor, the transistor 112 can be turned off, or even if the transistor 112 is a transistor whose drain current at Vgs of 0 V is large, the drain current of the transistor 112 can be suppressed. Accordingly, current flow from the wiring 16 to the wiring 13 can be prevented or suppressed, by which power consumption can be reduced.

Further, when the signal OUT is at the low level, the potentials of the gates of the transistors 112 and 114 are lower than VH, and thus Vgs of the transistors 112 and are small. Accordingly, degradation of the transistors 112 and 114 can be suppressed.

Heretofore, the driving method of the semiconductor device shown in FIG. 1A is described.

Next, semiconductor devices different from FIG. 1A are described with reference to FIGS. 2A, 2B, 3A, 3B, 4A, 4B, 5A, and 5B. Description is made on portions different from FIG. 1A, below.

Figure 2A:
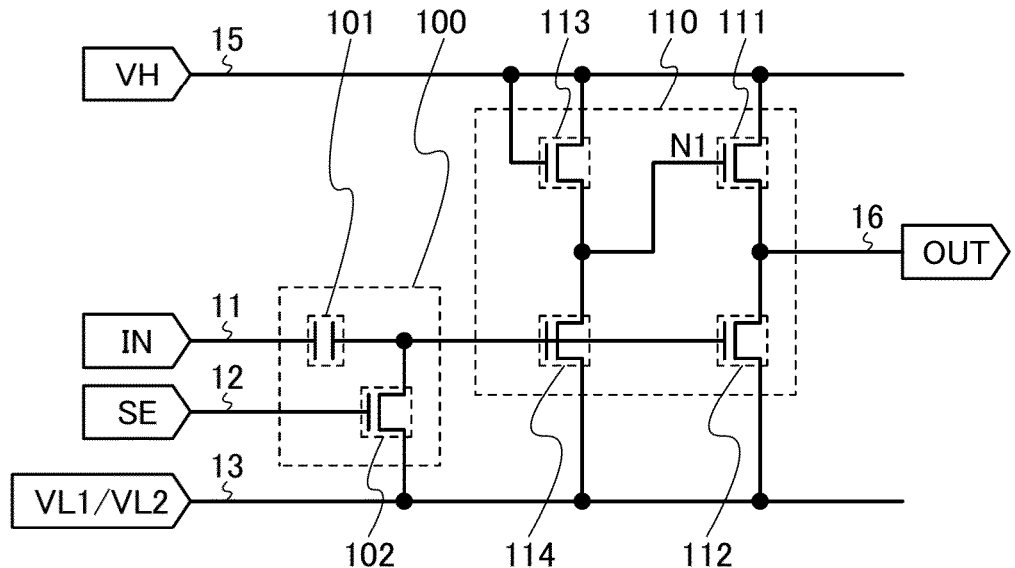
FIGS. 2A and 2B are diagrams for illustrating semiconductor devices according to embodiments of the present invention.

As shown in FIG. 2A, the wiring 14 in the semiconductor device shown in FIG. 1A can be omitted, and the first terminal of the transistor 102 may be connected to the wiring 13. Then, the potential VL2 may be supplied to the wiring 13 in the period T0 and the potential VL1 may be supplied to the wiring 13 in the period T1. Even in that case, the potential VL2 can be supplied to the other electrode of the capacitor 101 in the period T0, and thus an operation similar to that of the semiconductor device shown in FIG. 1A can be performed. Accordingly, an effect similar to that in the semiconductor device shown in FIG. 1A can be attained. Further, since the wiring 14 can be omitted, the number of wirings can be reduced as compared to that of the semiconductor device shown in FIG. 1A.

Further, in the semiconductor device shown in FIG. 2A, the potential of the wiring 13 may not be changed but remain the potential VL1 and the potential of the wiring 11 may be set to be higher than the potential VL1 and lower than the potential VH in the period T0. Even in that case, the potential of the other electrode of the capacitor 101 can become a potential lower than the potential VL1 when the signal IN is at the low level in the period T1, and thus an operation similar to that of the semiconductor device shown in FIG. 1A can be performed. Accordingly, an effect similar to that in the semiconductor device shown in FIG. 1A can be attained. Further, since the power supply potential can be fixed, a configuration of a power supply circuit to supply the potential to the wiring 13, or the like can be simplified.

Figure 2B:
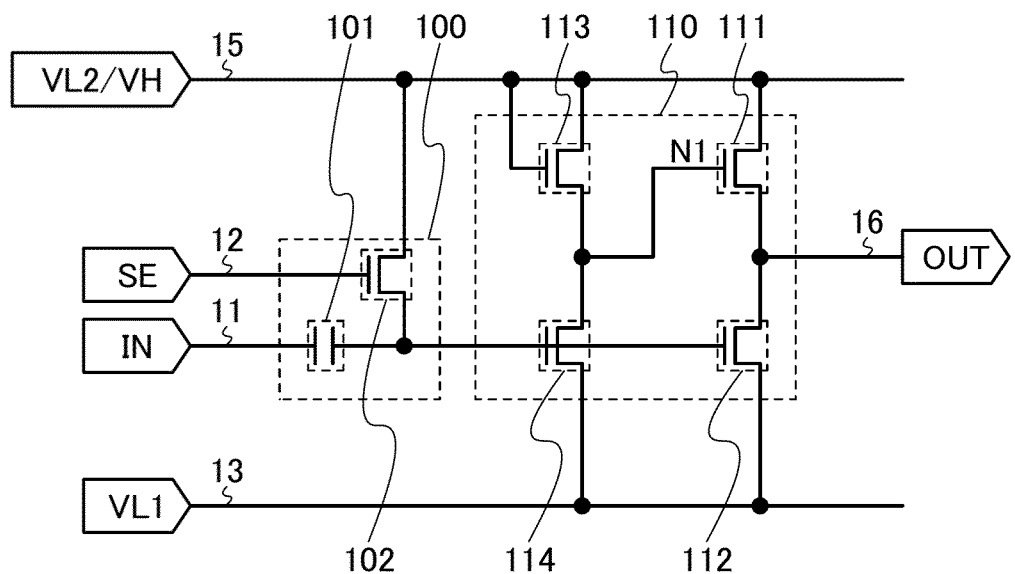

As shown in FIG. 2B, the wiring 14 in the semiconductor device shown in FIG. 1A can be omitted, and the first terminal of the transistor 102 may be connected to the wiring 15. Then, the potential VL2 may be supplied to the wiring 15 in the period T0 and the potential VH may be supplied to the wiring 15 in the period T1. Even in that case, the potential VL2 can be supplied to the other electrode of the capacitor 101 in the period T0, and thus an operation similar to that of the semiconductor device shown in FIG. 1A can be performed. Accordingly, an effect similar to that in the semiconductor device shown in FIG. 1A can be attained. Further, since the wiring 14 can be omitted, the number of wirings can be smaller than that in the semiconductor device shown in FIG. 1A.

Figure 3A:
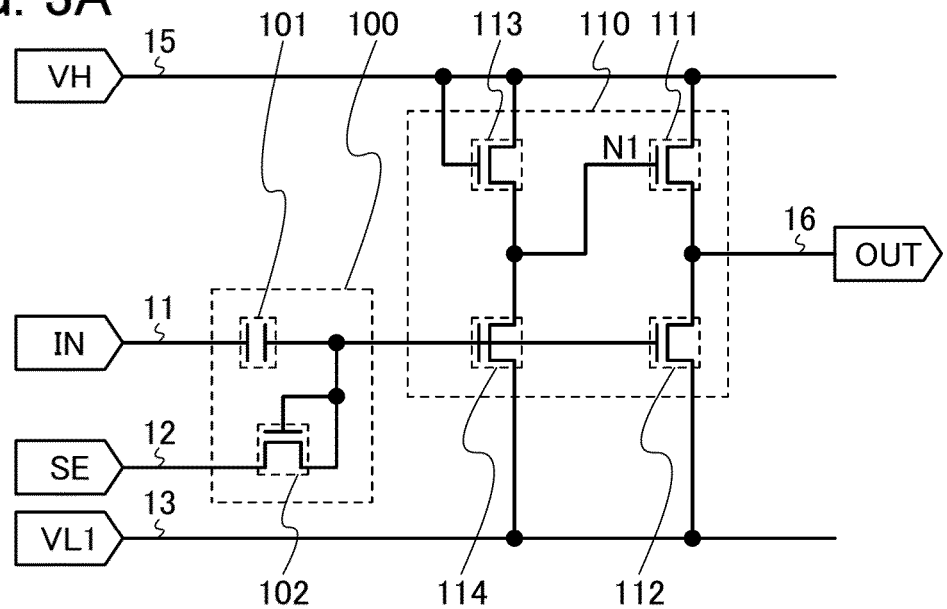
FIGS. 3A and 3B are diagrams for illustrating semiconductor devices according to embodiments of the present invention.

As shown in FIG. 3A, the wiring 14 in the semiconductor device shown in FIG. 1A can be omitted, and the first terminal of the transistor 102 may be connected to the wiring 12 and the second terminal and the gate of the transistor 102 may be connected to the other electrode of the capacitor 101. Then, the signal SE may be set at the low level in the period T0 and at the high level in the period T1. Even in that case, the potential of the other electrode of the capacitor 101 can become a potential lower than the potential VL1 in the period T0, and thus an operation similar to that of the semiconductor device shown in FIG. 1A can be performed. Accordingly, an effect similar to that in the semiconductor device shown in FIG. 1A can be attained. Further, since the wiring 14 can be omitted, the number of wirings can be smaller than that in the semiconductor device shown in FIG. 1A.

Figure 3B:
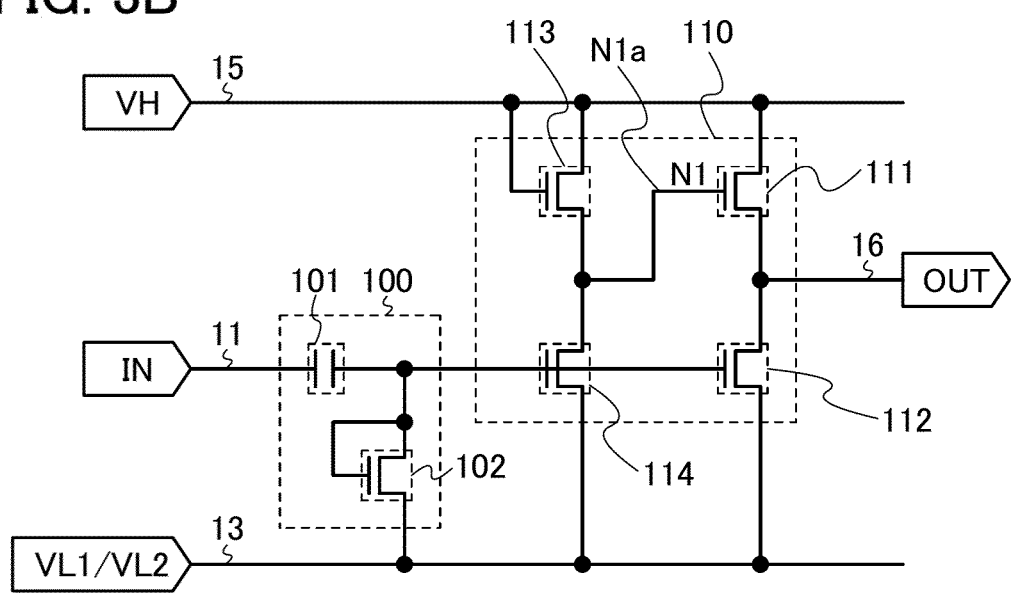

As shown in FIG. 3B, the wirings 12 and 14 in the semiconductor device shown in FIG. 1A can be omitted, and the first terminal of the transistor 102 may be connected to the wiring 13 and the second terminal and the gate of the transistor 102 may be connected to the other electrode of the capacitor 101. Then, the potential VL2 may be supplied to the wiring 13 in the period T0 and the potential VL1 may be supplied to the wiring 13 in period T1. Even in that case, the potential of the other electrode of the capacitor 101 can become a potential lower than the potential VL1 in the period T0, and thus an operation similar to that of the semiconductor device shown in FIG. 1A can be performed. Accordingly, an effect similar to that in the semiconductor device shown in FIG. 1A can be attained. Further, since the wirings 12 and 14 can be omitted, the number of wirings can be smaller than that in the semiconductor device shown in FIG. 1A.

Figure 4A:
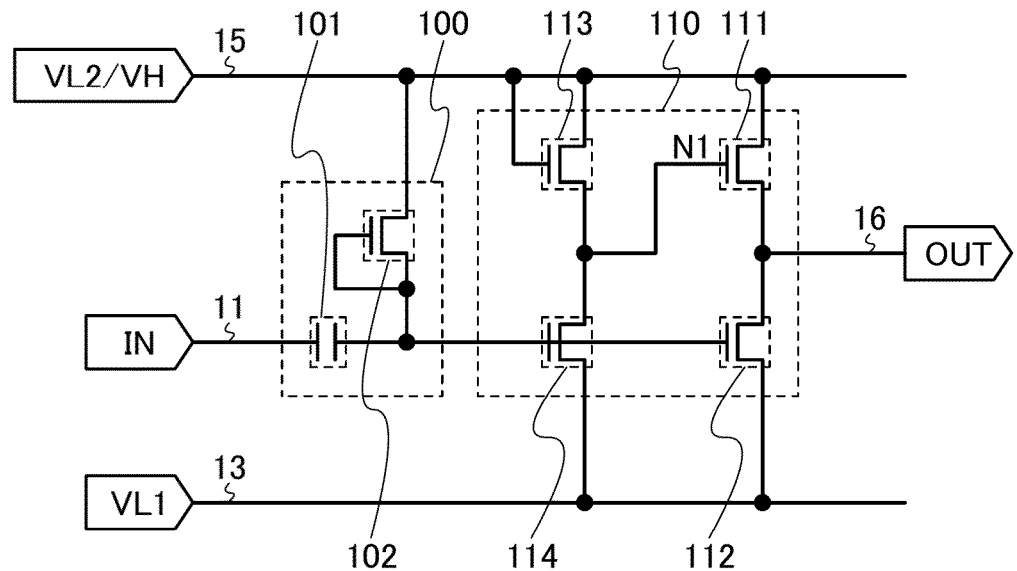
FIGS. 4A and 4B are diagrams for illustrating semiconductor devices according to embodiments of the present invention.

As shown in FIG. 4A, the wirings 12 and 14 in the semiconductor device shown in FIG. 1A can be omitted, and the first terminal of the transistor 102 may be connected to the wiring 15 and the second terminal and the gate of the transistor 102 may be connected to the other electrode of the capacitor 101. Then, the potential VL2 may be supplied to the wiring 15 in the period T0 and the potential VH may be supplied to the wiring 15 in period T1. Even in that case, the potential of the other electrode of the capacitor 101 can become a potential lower than the potential VL1 in the period T0, and thus an operation similar to that of the semiconductor device shown in FIG. 1A can be performed. Accordingly, an effect similar to that in the semiconductor device shown in FIG. 1A can be attained. Further, since the wirings 12 and 14 can be omitted, the number of wirings can be smaller than that in the semiconductor device shown in FIG. 1A.

Figure 4B:
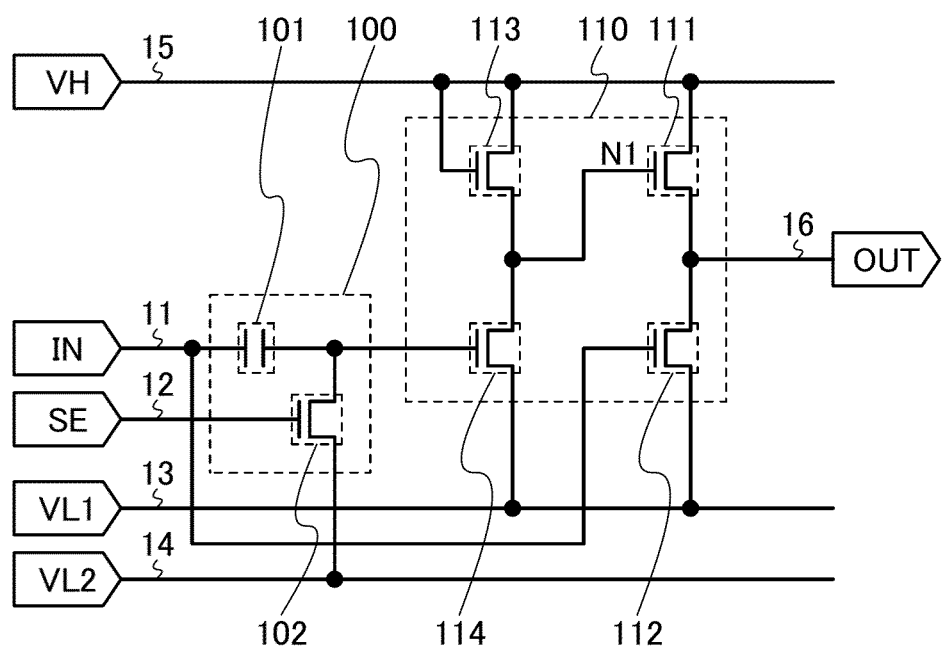

As shown in FIG. 4B, the gate of the transistor 112 may be connected to the wiring 11 in the semiconductor device shown in FIG. 1A. In the semiconductor device shown in FIG. 4B, the timing at which the potential VL1 of the wiring 13 is supplied to the wiring 16 through the transistor 112 is controlled by the signal IN. Since the signal IN rises or falls faster than the signal INO, the transistor 112 can be turned on or off sooner than the case where the gate of the transistor 112 is connected to the other electrode of the capacitor 101. Accordingly, the timing at which the potential VL1 of the wiring 13 is supplied to the wiring 16 becomes sooner, so that the fall time of the signal OUT can be reduced. Further, as the timing at which the transistor 112 is turned off gets sooner, the time during which a flow-through current between the wirings 15 and 13 flows can be shortened, whereby power consumption can be reduced.

Like the semiconductor device shown in FIG. 4B, the gate of the transistor 112 may be connected to the wiring 11 also in any semiconductor device shown in FIGS. 2A, 2B, 3A, 3B, and 4A. Also in that case, an effect similar to that in the semiconductor device shown in FIG. 4B can be attained.

Figure 5A:
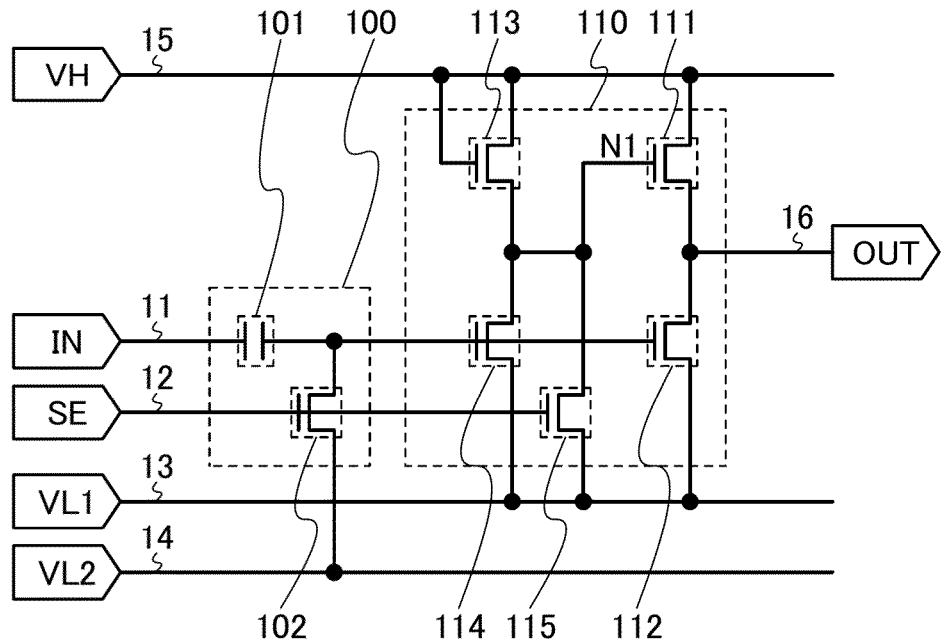
FIGS. 5A and 5B are diagrams for illustrating semiconductor devices according to embodiments of the present invention.

As shown in FIG. 5A, a transistor 115 whose first terminal is connected to the wiring 13, second terminal is connected to the gate of the transistor 111, and gate is connected to the wiring 12 may be provided in the semiconductor device shown in FIG. 1A. The potential VL1 of the wiring 13 is supplied to the gate of the transistor 111 through the transistor 115. The timing at which the potential VL1 is supplied to the gate of the transistor 111 through the transistor 115 is controlled by the signal SE of the wiring 12. In the semiconductor device shown in FIG. 5A, the potential VL1 of the wiring 13 can be supplied to the gate of the transistor 111 in the period T0, whereby the semiconductor device can be initialized. Accordingly, malfunction of the semiconductor device can be prevented.

Further, in the semiconductor device shown in FIG. 5A, the first terminal of the transistor 115 may be connected to the wiring 14. Even in that case, an operation similar to that in the case where the first terminal of the transistor 115 is connected to the wiring 13 can be performed.

In the case where the timing at which the offset voltage is generated does not coincide with the timing at which initialization is performed, the gate of the transistor 115 may be connected to the wiring to which a signal for initialization is input.

The transistor 115 whose first terminal is connected to the wiring 13 or the wiring 14, second terminal is connected to the gate of the transistor 111, and gate is connected to the wiring 12 may be provided also in any semiconductor device shown in FIGS. 2A, 2B, 3A, 3B, 4A, and 4B. Also in that case, an effect similar to that in the semiconductor device shown in FIG. 5A can be attained.

Figure 5B:
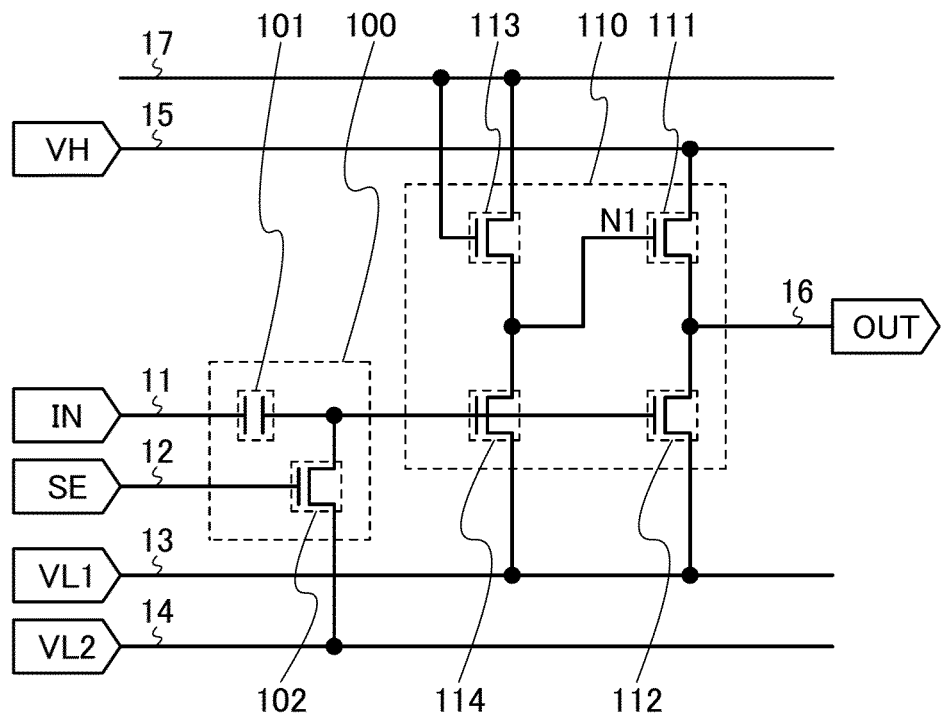

As shown in FIG. 5B, the second terminal and the gate of the transistor 113 may be connected to a wiring 17 in the semiconductor device shown in FIG. 1A. To the wiring 17, the potential VH, a potential higher than the potential VL1 and lower than the potential VH, or a signal may be supplied. An example of the signal which is input to the wiring 17 is an inverted signal of the signal IN. Therefore, the wiring 11 may be connected to the wiring 17 with an inverter provided therebetween. In that case, the transistor 113 is turned off when the transistor 114 is turned on, whereby current can be prevented from flowing between the wiring 15 and the wiring 13. Thus, power consumption can be reduced. Further, there is no need to make the W/L ratio of the transistor 114 sufficiently larger than that of the transistor 113, leading to a reduction in size of the transistor.

The second terminal and the gate of the transistor 113 may be connected to the wiring 17 also in any semiconductor device shown in FIGS. 2A, 2B, 3A, 3B, 4A, 4B, and FIG. 5A. Also in that case, an effect similar to that in the semiconductor device shown in FIG. 5B can be attained.

Figure 22A:
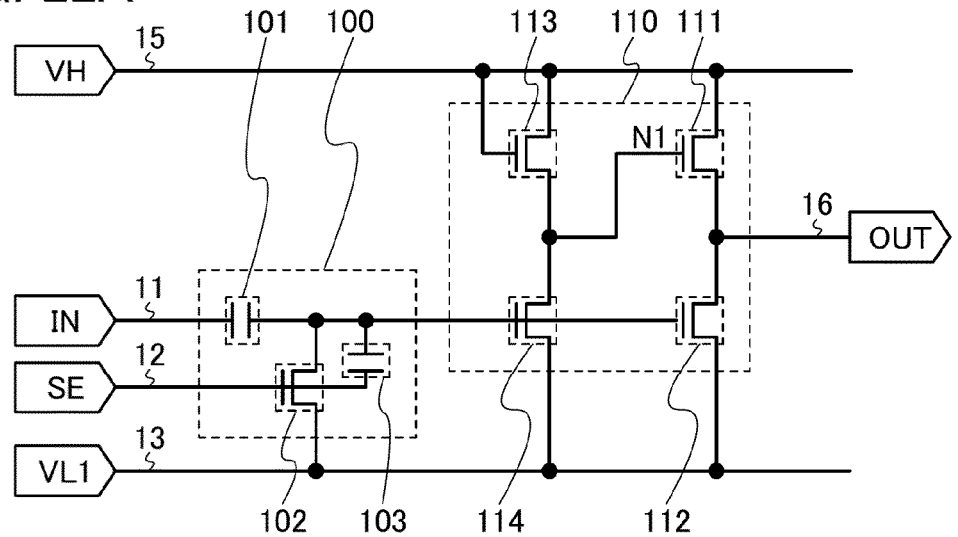
FIGS. 22A and 22B are diagrams for illustrating semiconductor devices according to embodiments of the present invention.

As shown in FIG. 22A, the wiring 14 in the semiconductor device shown in FIG. 1A can be omitted, and the first terminal of the transistor 102 may be connected to the wiring 13, and a capacitor 103 one electrode of which is connected to the wiring 12 and the other electrode of which is connected to the other electrode of the capacitor 101 may be provided. The capacitor 103 holds a potential difference between the wiring 12 and the other electrode of the capacitor 101. Further, in the semiconductor device shown in FIG. 22A, the potential VL1 of the wiring 13 is supplied to the other electrode of the capacitor 101 through the transistor 102. In the semiconductor device shown in FIG. 22A, in the period T0, the signal IN at the low level is input to the one electrode of the capacitor 101, and the potential VL1 of the wiring 13 is supplied to the other electrode of the capacitor 101 through the transistor 102. Then, the signal SE is changed from the high level to the low level, so that the transistor 102 is turned off, and thus the potential of the other electrode of the capacitor 101 becomes a potential lower than the potential VL1 owing to the capacitive coupling with the capacitor 103. Accordingly, the potential of the other electrode of the capacitor 101 becomes the potential lower than the potential VL1 in the period T0, and thus an operation similar to that of the semiconductor device shown in FIG. 1A can be performed. Accordingly, an effect similar to that in the semiconductor device shown in FIG. 1A can be attained. Further, since the wiring 14 can be omitted, the number of wirings can be smaller than that in the semiconductor device shown in FIG. 1A. In addition, since the potential VL2 is not used, the number of power supply potentials can be reduced.

Figure 22B:
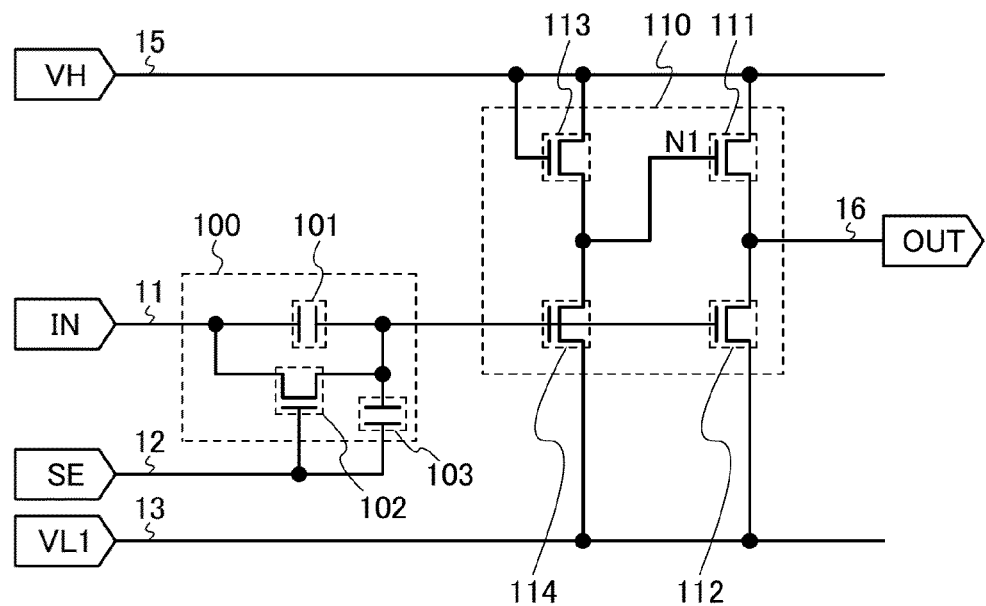
Figure 23:
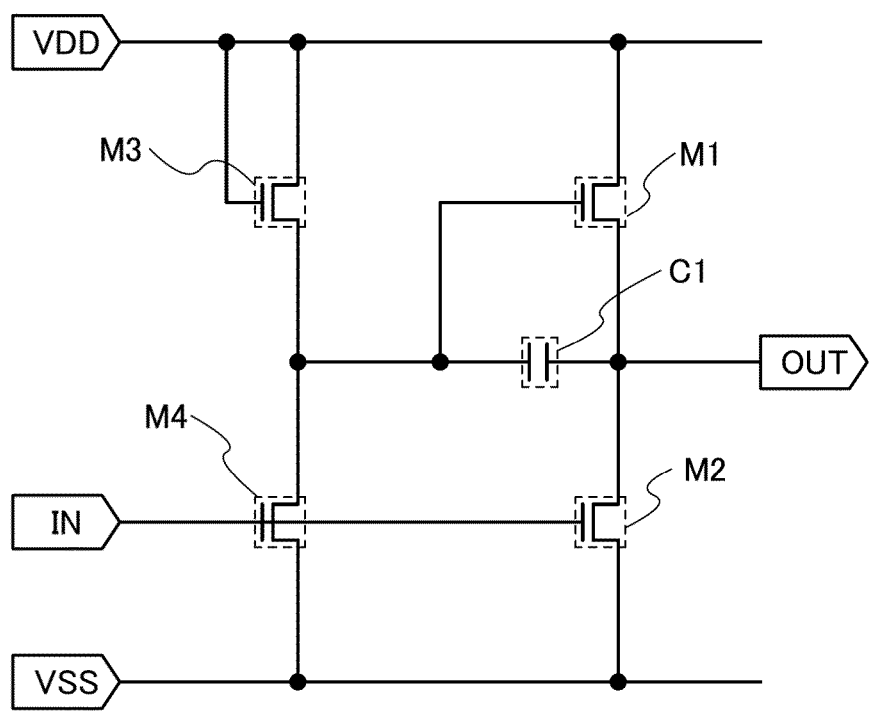
FIG. 23 is a diagram illustrating a conventional driver circuit.

As shown in FIG. 22B, the first terminal of the transistor 102 may be connected to the wiring 11 in the semiconductor device shown in FIG. 22A. Also in that case, in the period T0, the signal IN at the low level can be supplied to the other electrode of the capacitor 101 through the transistor 102, and thus an operation similar to that of the semiconductor device shown in FIG. 22A can be performed. Accordingly, an effect similar to that in the semiconductor device shown in FIG. 22A can be attained.

The capacitor 103 may be omitted in any semiconductor device shown in FIGS. 22A and 22B. In that case, parasitic capacitance between the gate and the second terminal of the transistor 102 may be used instead of the capacitor 103.

In any semiconductor device shown in FIGS. 22A and 22B, the one electrode of the capacitor 103 may be connected to a wiring other than the wiring 12. It is preferable that a signal input to the wiring is changed from a high level to a low level after the signal SE is changed from the high level to the low level in the period T0. This is because the potential of the other electrode of the capacitor 101 can be decreased after the transistor 102 is turned off. Further, it is preferable that the timing at which the signal input to the wiring is changed from the low level to the high level is in the period during which the signal SE is at the high level.

Also in any semiconductor device shown in FIGS. 2A, 2B, 3A, 3B, 4A, 4B, 5A, and 5B, the wiring 14 can be omitted, and the first terminal of the transistor 102 may be connected to the wiring 11 or the wiring 13, and the capacitor 103 one electrode of which is connected to the wiring 12 and the other electrode of which is connected to the other electrode of the capacitor 101 may be provided.

Further, a capacitor may be connected between the gate and the second terminal of the transistor 111 in any semiconductor device shown in FIGS. 2A, 2B, 3A, 3B, 4A, 4B, 5A, 5B, 22A, and 22B, though not shown. Thus, the capacitance value between the wiring 16 and the node N1 can be increased. Accordingly, in the period during which the signal IN is at the low level, the potential of the node N1 can become a higher potential than the potential of the node N1 in the case where no capacitor is provided between the gate and the second terminal of the transistor 111. That is, Vgs of the transistor 111 can be increased. The drain current of the transistor 111 can be increased accordingly, which shorten the rise time of the signal OUT.

Further, a MOS capacitor may be used as the capacitor 101 in any semiconductor device shown in FIGS. 2A, 2B, 3A, 3B, 4A, 4B, 5A, 5B, 22A, and 22B, though not shown. In that case, it is preferable that a gate of the transistor used as the MOS capacitor is connected to the wiring 11, and a source or a drain of the transistor is connected to the second terminal of the transistor 102. Thus, the capacitance value per unit area can be increased because the potential of the wiring 11 is higher than that of the second terminal of the transistor 102.

Heretofore, the semiconductor devices whose configurations are different from FIG. 1A are described.

As the W/L ratio of the transistor 111 increases, the rise time of the signal OUT can be shortened. Therefore, it is preferable that the W/L ratio of the transistor 111 is the largest among the transistors in the semiconductor device. That is, it is preferable that the W/L ratio of the transistor 111 is larger than any of those of the transistors 102, 112, 113, and 114.

The transistor 112 supplies a potential to a load connected to the wiring 16, whereas the transistor 114 supplies a potential to the gate of the transistor 111. In addition, as the W/L ratio of the transistor 112 increases, the fall time of the signal OUT can be shortened. Therefore, it is preferable that the W/L ratio of the transistor 112 is larger than that of the transistor 114.

On the other hand, there is no need to make the W/L ratio of the transistor 102, which is used for supplying charge to the other electrode of the capacitor 101 in the period T0, large. Therefore, it is preferable that the W/L ratio of the transistor 102 is smaller than that of the transistor 112 or the transistor 114.

Further, as the capacitance value of the capacitor 101 gets larger than the total of the gate capacitance of the transistors 112 and 114, the amplitude voltage of the signal INO can get closer to that of the signal IN. Therefore, it is preferable that the capacitance value of the capacitor 101 is larger than the total of the gate capacitance of the transistors 112 and 114. Further or alternatively, when the one electrode of the capacitor 101 is formed of the same material as a gate electrode of a transistor and the other electrode of the capacitor 101 is formed of the same material as a source or drain electrode of the transistor, it is preferable that the area where the two electrodes of the capacitor 101 are overlapped with each other is larger than the sum of the area where the gate and source of the transistor 112 are overlapped with each other, the area where the gate and drain of the transistor 112 are overlapped with each other, the area where the gate and source of the transistor 114 are overlapped with each other, and the area where the gate and drain of the transistor 114 are overlapped with each other.

In the period T0, the potential VL1 may not be supplied to the wiring 13, so that the wiring 13 can be made in a floating state, or the potential VH may not be supplied to the wiring 15, so that the wiring 15 can be made in a floating state; thus, malfunction in the period T0 can be prevented.

In the period T1, the potential VL2 may not be supplied to the wiring 14, so that the wiring 14 can be made in a floating state.

A low-level signal may be input to the wiring 15 in the period during which the signal IN is at the high level. In that case, the transistor 113 is turned off when the transistor 114 is turned on, whereby current can be prevented from flowing between the wiring 15 and the wiring 13. Thus, power consumption can be reduced. Further, there is no need to make the W/L ratio of the transistor 114 sufficiently larger than that of the transistor 113, leading to a reduction in size of the transistor.

This embodiment can be implemented in appropriate combination with any other embodiment and the like.

Embodiment 2

In this embodiment, the case where the semiconductor device which is one embodiment of the present invention is used for a flip-flop circuit included in a shift register is described. Description is made on portions different from Embodiment 1.

Figure 6A:
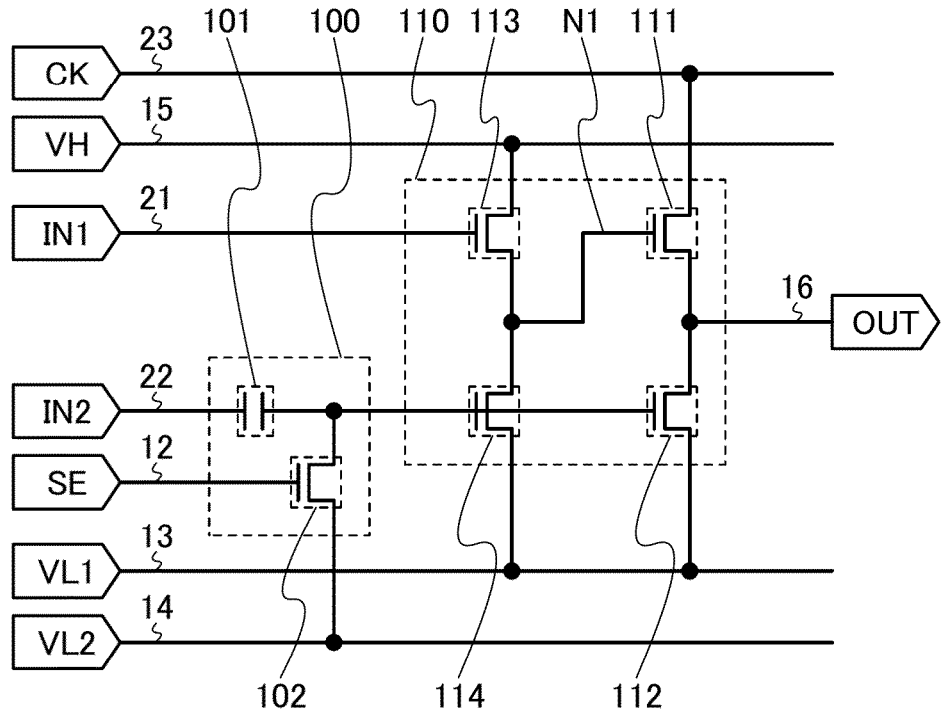
FIGS. 6A and 6B are diagrams for illustrating semiconductor devices according to embodiments of the present invention.

The semiconductor device of this embodiment is described with reference to FIG. 6A. FIG. 6A is a circuit diagram of the semiconductor device of this embodiment. The semiconductor device in FIG. 6A is different from that shown in FIG. 1A in that the first terminal of the transistor 111 is connected to a wiring 23, the gate of the transistor 113 is connected to a wiring 21, and the one electrode of the capacitor 101 is connected to a wiring 22.

Signal IN1 is input to the wiring 21. The signal IN1 is an input signal of the semiconductor device and serves as a start pulse. For example, the signal IN1 is a digital signal whose high-level potential is VH and low-level potential is VL1. The wiring 21 transmits the signal IN1.

Signal IN2 is input to the wiring 22. The signal IN2 is an input signal of the semiconductor device and serves as a reset signal. For example, the signal IN2 is a digital signal whose high-level potential is VH and low-level potential is VL1. The wiring 22 transmits the signal IN2.

Signal CK is input to the wiring 23. The signal CK is an input signal of the semiconductor device. For example, the signal CK is a digital signal whose high-level potential is VH and low-level potential is VL1. The signal CK is a clock signal whose potential is switched between the high level and the low level repeatedly. The wiring 23 transmits the signal CK.

The wirings 21, 22, and 23 are also called signal lines. In particular, the wiring 23 is also called a clock signal line.

Figure 7:
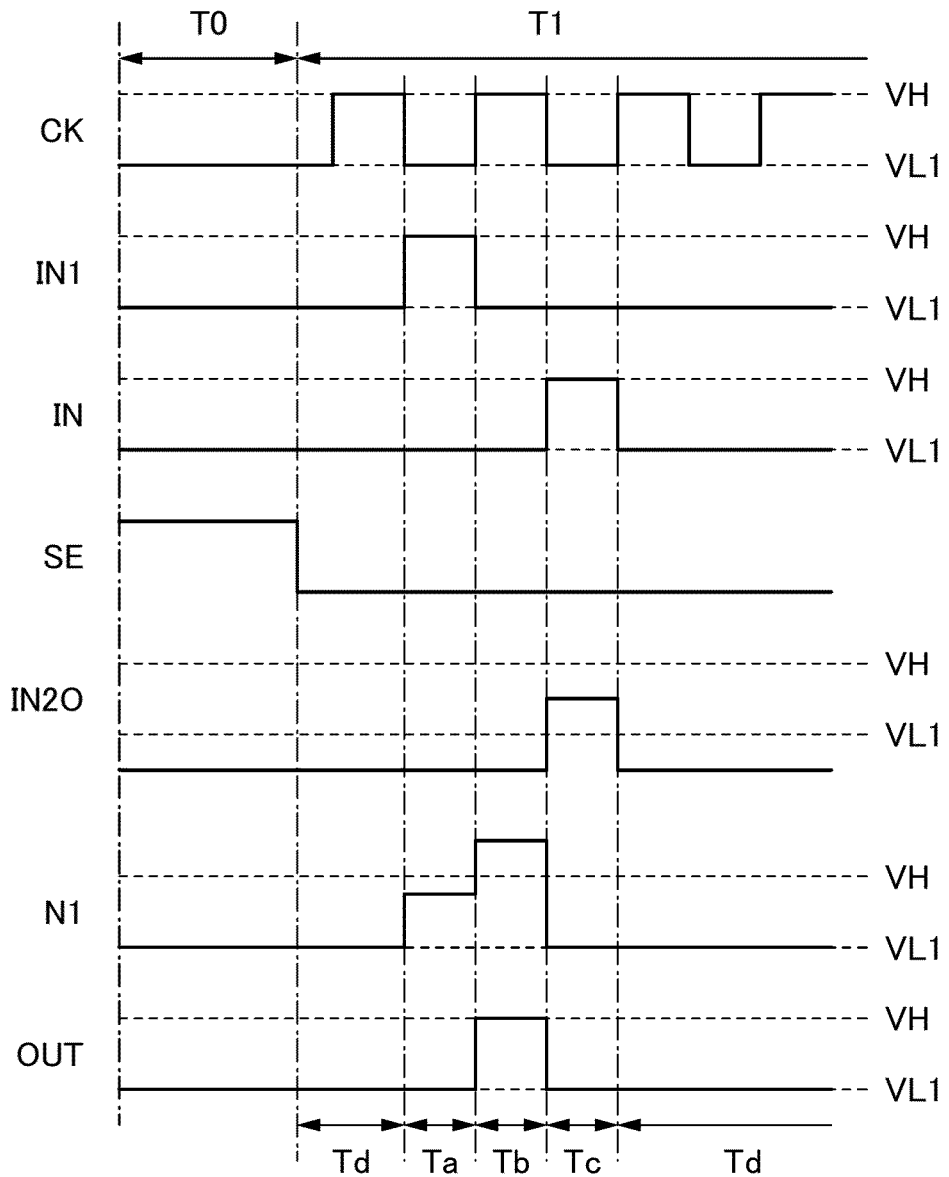
FIG. 7 is a chart for illustrating a semiconductor device according to one embodiment of the present invention.

Next, an example of a driving method of the semiconductor device shown in FIG. 6A is described with reference to FIG. 7. FIG. 7 is an example of a timing chart for describing the driving method of the semiconductor device shown in FIG. 6A.

In a period T0, the signal IN2 is set at a low level, so that the potential of the one electrode of the capacitor 101 becomes VL1. Further, the signal SE is set at the high level to turn on the transistor 102. Consequently, the potential VL2 of the wiring 14 is supplied to the other electrode of the capacitor 101, so that the potential of the other electrode of the capacitor 101 becomes VL2. In this manner, a difference between the low-level potential VL1 of the signal IN2 and the potential VL2 of the wiring 14 supplied through the transistor 102, i.e., the difference (VL1−VL2), is held in the capacitor 101. The difference (VL1−VL2) corresponds to an offset voltage.

In a period T1, the signal SE is changed to the low level to turn off the transistor 102, whereby the other electrode of the capacitor 101 is made into the floating state. Since the capacitor 101 holds the potential difference (VL1–VL2) in the period T0, a signal obtained by subtracting the potential difference (VL1–VL2) from the potential of signal IN2 is generated as a signal IN2O. Therefore, when the signal IN2 is at the low level, the signal IN2O becomes a low level whose potential is lower than VL1; when the signal IN2 is at a high level, the signal IN2O becomes a high level whose potential is lower than VH.

The driving method of the semiconductor device shown in FIG. 6A in the period T1 is described separately for each of a period Ta, a period Tb, a period Tc, and a period Td.

In the period Ta, since the signal IN2 is at the low level, the signal IN2O becomes the low level, so that the transistors 112 and 114 are turned off. Further, the signal IN1 is changed to the high level, so that the transistor 113 is turned on. Consequently, the potential VH of the wiring 15 is supplied to the node N1, and accordingly the potential of the node N1 increases. Consequently, the transistor 111 is turned on, so that the signal CK of the wiring 23 is supplied to the wiring 16. Since the signal CK is at the low level in the period Ta, the signal OUT becomes the low level whose potential is VL1. Then, the potential of the node N1 reaches a potential obtained by subtracting the threshold voltage of the transistor 113 from the potential VH, so that the transistor 113 is turned off to make the node N1 in the floating state. A potential difference between the node N1 and the wiring 16 at the time when the transistor 113 is turned off is held between the gate and the second terminal of the transistor 111.

In the period Tb, since the signal IN2 is kept at the low level, the signal IN2O is also kept at the low level, so that the transistors 112 and 114 are kept off. Further, the potential of the signal IN1 is changed to the low level, so that the transistor 113 is kept off. Therefore, the node N1 is kept in the floating state. Since the node N1 is kept at the potential in the period Ta, the transistor 111 is kept on, and thus the signal CK of the wiring 23 is kept supplied to the wiring 16. In the period Tb, the potential of the signal CK is changed to the high level, so that the potential of the wiring 16 increases. In the meantime, the potential difference between the node N1 and the wiring 16 in the period Ta is kept to be held between the gate and the second terminal of the transistor 111. Accordingly, the potential of the node N1 further increases to be higher than the potential VH along with the increase in the potential of the wiring 16. Accordingly, the signal OUT becomes the high-level potential which is VH.

In the period Tc, the level of the signal IN2 is changed to the high level, and thus the level of the signal IN2O is also changed to the high level, so that the transistors 112 and 114 are turned on. Consequently, the potential VL1 of the wiring 13 is supplied to the wiring 16 through the transistor 112 and to the node N1 through the transistor 114. On the other hand, the signal IN1 is kept at the low level, and thus the transistor 113 is kept off. Accordingly, the potential of the node N1 is changed to the potential VL1, so that the transistor 111 is turned off. Accordingly, the signal OUT becomes the low-level potential which is VL1.

In the period Td, the level of the signal IN2 is changed to the low level, and thus the level of the signal IN2O is also changed to the low level, so that the transistors 112 and 114 are turned off. Further, the signal IN1 is kept at the low level, and thus the transistor 113 is kept off. Accordingly, the node N1 is kept at the potential VL1 in the period Tc, so that the transistor 111 is kept off. Further, the wiring 16 is kept at the potential VL1 in the period Tc, so that the signal OUT is kept at the low-level potential.

As described above, when the signal IN2 is at the low level, the potential of the gate of the transistor 114 is lower than VL1, and thus Vgs of the transistor 114 is a negative value; therefore, even if the transistor 114 is a depletion transistor, the transistor 114 can be turned off, or even if the transistor 114 is a transistor whose drain current at Vgs of 0 V is large, the drain current of the transistor 114 can be suppressed. Accordingly, the gate of the transistor 111 can be made into the floating state, whereby malfunction of the circuit 110 can be prevented.

Further, when the signal IN2 is at the high level, the potentials of the gates of the transistors 112 and 114 are lower than VH, and thus Vgs of the transistors 112 and 114 are small. Accordingly, degradation of the transistors 112 and 114 can be suppressed.

Heretofore, the driving method of the semiconductor device shown in FIG. 6A is described.

Next, semiconductor devices different from FIG. 6A are described with reference to FIGS. 6B, 8A, 8B, 9A, 9B, and 10A. Description is made on portions different from FIG. 6A, below.

Figure 6B:
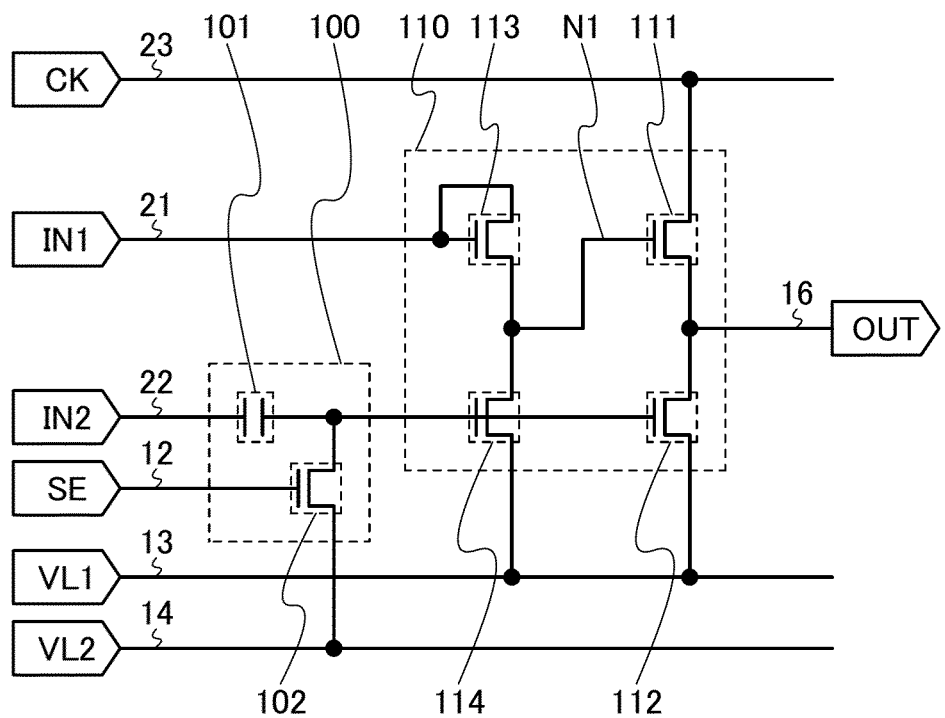

As shown in FIG. 6B, the first terminal of the transistor 113 may be connected to the wiring 21 in the semiconductor device shown in FIG. 6A. In the semiconductor device shown in FIG. 6B, the signal IN1 of the wiring 21 is supplied to the node N1 through the transistor 113 in the period Ta. In the period Ta, since the signal IN1 is at the high level, the potential of the node N1 increases. Then, the potential of the node N1 reaches a potential obtained by subtracting the threshold voltage of the transistor 113 from the potential VH, so that the transistor 113 is turned off. The transistor 113 is kept off in the periods Tb, Tc, and Td. Accordingly, an operation similar to that of the semiconductor device shown in FIG. 6A can be performed. Accordingly, an effect similar to that in the semiconductor device shown in FIG. 6A can be attained. Further, since the wiring 15 can be omitted, the number of wirings can be smaller than that in the semiconductor device shown in FIG. 6A.

Figure 8A:
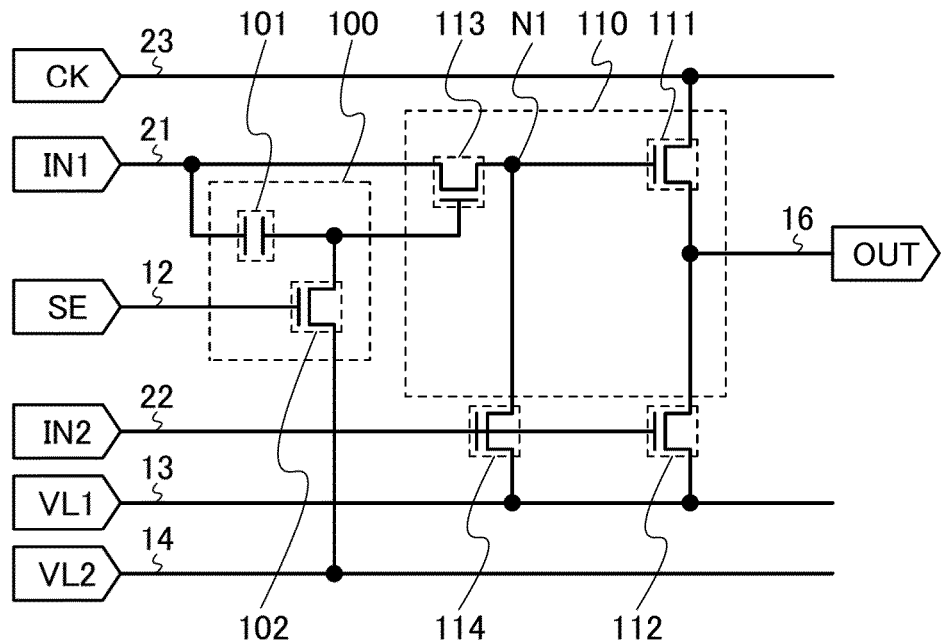
FIGS. 8A and 8B are diagrams for illustrating semiconductor devices according to embodiments of the present invention.

As shown in FIG. 8A, the circuit 100 in the semiconductor device shown in FIG. 6B may be connected to the wiring 21 instead of the wiring 22. In the semiconductor device shown in FIG. 8A, the signal IN1 of the wiring 21 connected to the circuit 100 is offset to generate a signal IN1O and the signal IN1O is supplied to the gate of the transistor 113. The one electrode of the capacitor 101 is connected to the wiring 21, and the other electrode thereof is connected to the gate of the transistor 113. The first terminal of the transistor 102 is connected to the wiring 14, the second terminal of the transistor 102 is connected to the other electrode of the capacitor 101, and the gate of the transistor 102 is connected to the wiring 12. The capacitor 101 holds a potential difference between the wiring 21 and the gate of the transistor 113, and the transistor 102 supplies the potential VL1 of the wiring 14 to the gate of the transistor 113. In the semiconductor device shown in FIG. 8A, Vgs of the transistor 113 can be suppressed to be negative; therefore, the W/L ratio of the transistor 113 can be made large without considering the amount of charge supplied to the node N1. Accordingly, the time the potential of the node N1 takes to reach the above-described potential can be shortened, increasing the driving frequency.

Figure 8B:
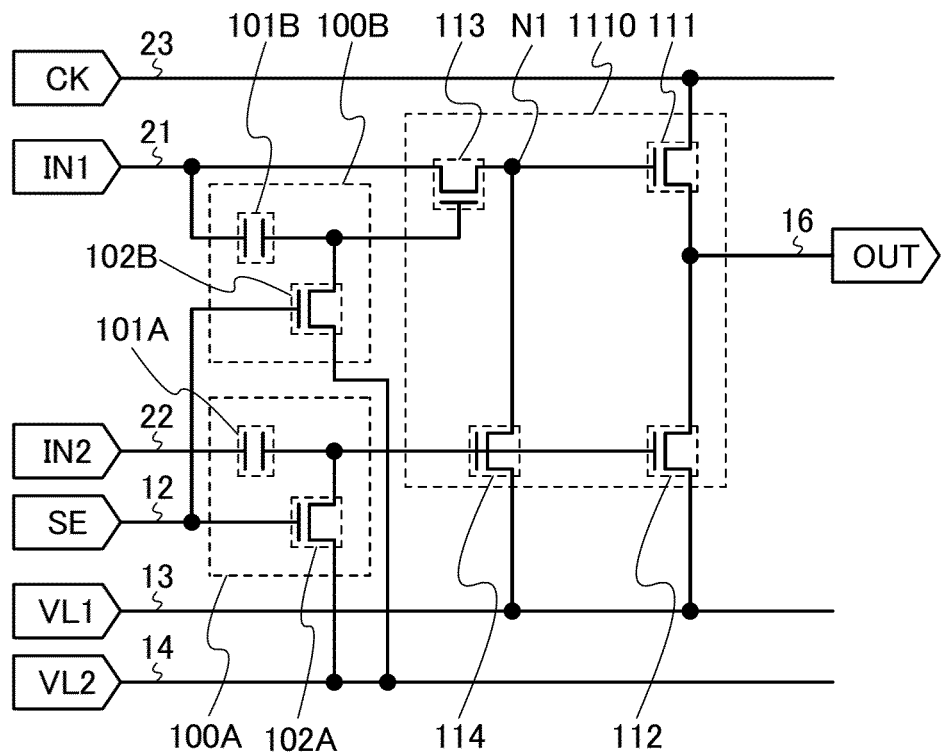

As shown in FIG. 8B, the circuit 100 may be provided not only for the wiring 22 but also for the wiring 21 in the semiconductor device shown in FIG. 6B. In FIG. 8B, the circuit 100 provided for the wiring 22, and the capacitor 101 and the transistor 102 included in the circuit 100 are denoted by a circuit 100A, a capacitor 101A, and a transistor 102A, respectively; the circuit 100 provided for the wiring 21, and the capacitor 101 and the transistor 102 included in the circuit 100 are denoted by a circuit 100B, a capacitor 101B, and a transistor 102B, respectively. The circuit 100A is similar to the circuit 100 shown in FIG. 6A, and the circuit 100B is similar to the circuit 100 shown in FIG. 8A; therefore, description thereof is skipped. An effect similar to that in the semiconductor device shown in FIG. 6B and an effect similar to that in the semiconductor device shown in FIG. 8A can be attained by the semiconductor device shown in FIG. 8B.

Figure 9A:
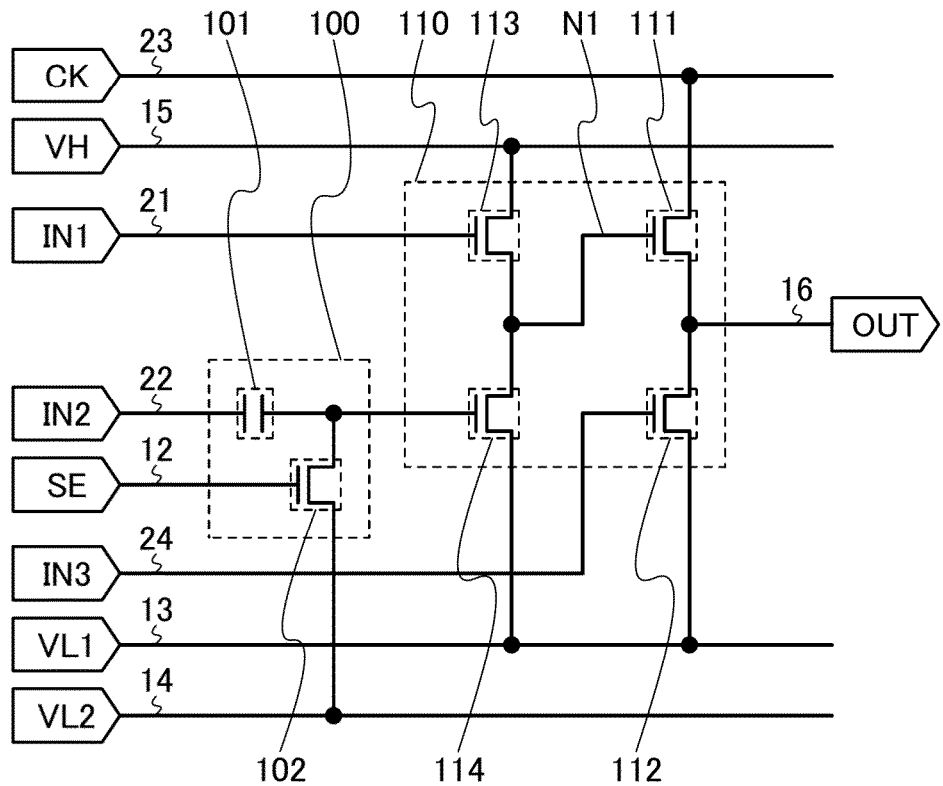
FIGS. 9A and 9B are diagrams for illustrating semiconductor devices according to embodiments of the present invention.

As shown in FIG. 9A, the gate of the transistor 112 may be connected to a wiring 24 in the semiconductor device shown in FIG. 6A. Signal IN3 is input to the wiring 24. The wiring 24 transmits the signal IN3. The signal IN3 is a digital signal whose high-level potential is VH and low-level potential is VL1. As examples of the signal IN3, there are a clock signal which is an inverted signal of the signal CK, a clock signal whose phase is shifted from that of the signal CK, and the like. In the semiconductor device shown in FIG. 9A, in the period Td, the transistor 112 is switched between on and off repeatedly, so that the potential VL1 of the wiring 13 can be supplied to the wiring 16 periodically, whereby the potential of the wiring 16 can be kept at VL1 more surely.

The gate of the transistor 112 may be connected to the wiring 24 also in any semiconductor device shown in FIGS. 6B, 8A, and 8B. Also in that case, an effect similar to that in the semiconductor device shown in FIG. 9A can be attained.

A transistor whose first terminal is connected to the wiring 13, second terminal is connected to the wiring 16, and gate is connected to the wiring 24 may be provided in any semiconductor device shown in FIGS. 6A, 6B, 8A, and 8B. Also in that case, an effect similar to that in the semiconductor device shown in FIG. 9A can be attained.

Figure 9B:
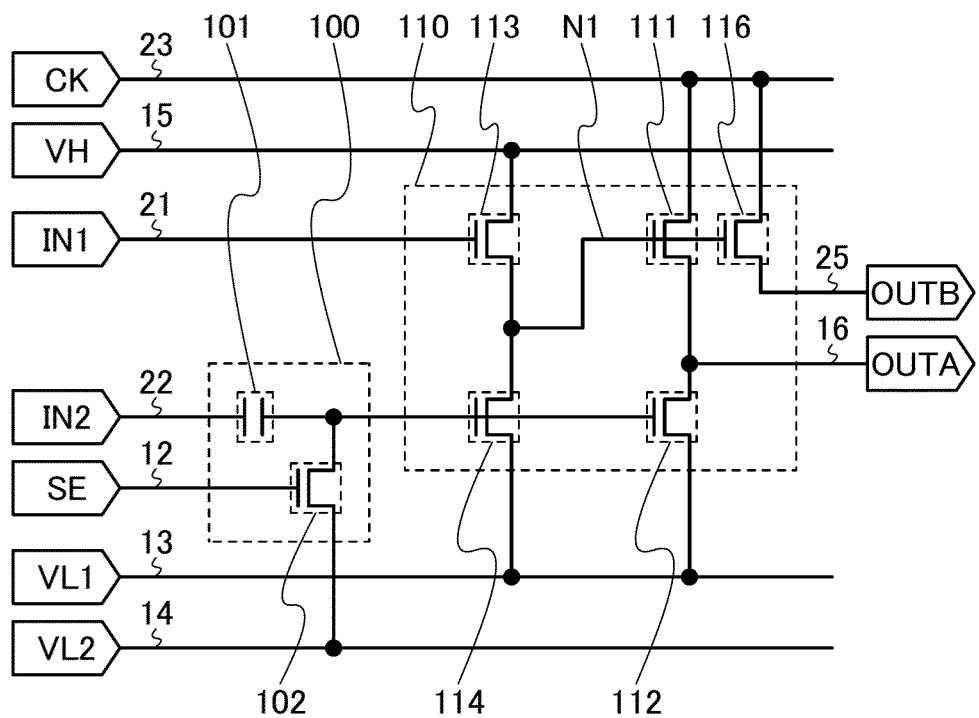

As shown in FIG. 9B, a transistor 116 whose first terminal is connected to the wiring 23, second terminal is connected to a wiring 25, and gate is connected to the gate of the transistor 111 may be provided in the semiconductor device shown in FIG. 6A. The transistor 116 supplies the signal CK of the wiring 23 to the wiring 25. The timing at which the signal CK of the wiring 23 is supplied to the wiring 25 is controlled by the potential of the node N1. The transistor 116 also holds a potential difference between the wiring 25 and the node N1. The signal OUT is output from the wiring 25. The wiring 25 transmits the signal OUT. In FIG. 9B, the signal OUT output from the wiring 16 is denoted by a signal OUTA whereas the signal OUT output from the wiring 25 is denoted by a signal OUTB. The signal OUTA is switched between a high level and a low level at the same timing as the signal OUTB. In the semiconductor device shown in FIG. 9B, one of the signal OUTA and the signal OUTB can be used as a forward signal of the shift register and the other can be used as a signal for driving a load or the like. Accordingly, with the semiconductor device shown in FIG. 9B used in the flip-flop circuit, normal operation can be performed even when a large load is driven.

The transistor 116 whose first terminal is connected to the wiring 23, second terminal is connected to the wiring 25, and gate is connected to the gate of the transistor 111 may be provided also in any semiconductor device shown in FIGS. 6B, 8A, 8B, and 9A. Also in that case, an effect similar to that in the semiconductor device shown in FIG. 9B can be attained.

Figure 10A:
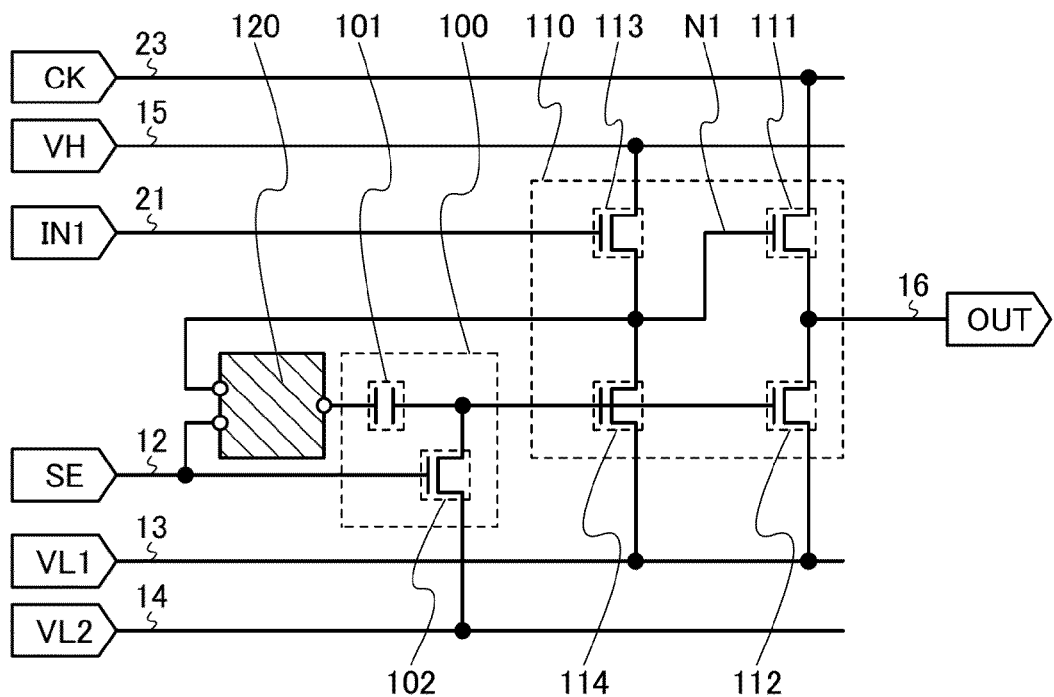
FIGS. 10A to 10C are diagrams for illustrating a semiconductor device according to one embodiment of the present invention.

As shown in FIG. 10A, a circuit 120 for generating the signal IN2 may be provided in the semiconductor device shown in FIG. 6A. The circuit 120 is connected to the node N1, the wiring 12, and the one electrode of the capacitor 101. The circuit 120 generates the signal IN2 in accordance with the potential of the node N1 and the signal SE of the wiring 12 and outputs to the one electrode of the capacitor 101. For example, the circuit 120 generates the signal IN2 at the low level when the signal SE is at the high level regardless of the potential of the node N1; and when the signal SE is at the low level, the circuit 120 generates the signal IN2 at the low level when the potential of the node N1 is high (e.g., the period Ta, the period Tb) and generates the signal IN2 at the high level when the potential of the node N1 is low (e.g., the period Tc, the period Td). That is, the circuit 120 serves as a NOR circuit.

The circuit 120 may be connected to the wiring 16 instead of the node N1.

The circuit 120 for generating the signal IN2 may be provided also in any semiconductor device shown in FIGS. 6B, 8A, 8B, 9A, and 9B.

Although not shown in the drawing, the second terminal of the transistor 102 may be connected to the wiring 13 also in any semiconductor device shown in FIGS. 6A, 6B, 8A, 8B, 9A, 9B, and 10A, like the semiconductor device shown in FIG. 2A. Also in that case, an effect similar to that in the semiconductor device shown in FIG. 2A can be attained.

Although not shown in the drawing, the second terminal of the transistor 102 may be connected to the wiring 15 also in any semiconductor device shown in FIGS. 6A, 6B, 8A, 8B, 9A, 9B, and 10A, like the semiconductor device shown in FIG. 2B. Also in that case, an effect similar to that in the semiconductor device shown in FIG. 2B can be attained.

Although not shown in the drawing, the first terminal of the transistor 102 may be connected to the wiring 12 and the gate of the transistor 102 may be connected to the second terminal of the transistor 102 also in any semiconductor device shown in FIGS. 6A, 6B, 8A, 8B, 9A, 9B, and 10A, like the semiconductor device shown in FIG. 3A. Also in that case, an effect similar to that in the semiconductor device shown in FIG. 3A can be attained.

Although not shown in the drawing, the first terminal of the transistor 102 may be connected to the wiring 13 and the gate of the transistor 102 may be connected to the second terminal of the transistor 102 also in any semiconductor device shown in FIGS. 6A, 6B, 8A, 8B, 9A, 9B, and 10A, like the semiconductor device shown in FIG. 3B. Also in that case, an effect similar to that in the semiconductor device shown in FIG. 3B can be attained.

Although not shown in the drawing, the first terminal of the transistor 102 may be connected to the wiring 15 and the gate of the transistor 102 may be connected to the second terminal of the transistor 102 also in any semiconductor device shown in FIGS. 6A, 6B, 8A, 8B, 9A, 9B, and 10A, like the semiconductor device shown in FIG. 4A. Also in that case, an effect similar to that in the semiconductor device shown in FIG. 4A can be attained.

Although not shown in the drawing, the gate of the transistor 112 may be connected to the one electrode of the capacitor 101 also in any semiconductor device shown in FIGS. 6A, 6B, 8A, 8B, 9A, 9B, and 10A, like the semiconductor device shown in FIG. 4B. Also in that case, an effect similar to that in the semiconductor device shown in FIG. 4B can be attained.

Although not shown in the drawing, the transistor 115 whose first terminal is connected to the wiring 13, second terminal is connected to the gate of the transistor 111, and gate is connected to the wiring 12 may be provided also in any semiconductor device shown in FIGS. 6A, 6B, 8A, 8B, 9A, 9B, and 10A, like the semiconductor device shown in FIG. 5A. Also in that case, an effect similar to that in the semiconductor device shown in FIG. 5A can be attained.

Although not shown in the drawing, the wiring 14 can be omitted, and the first terminal of the transistor 102 may be connected to the wiring 22 or the wiring 13, and the capacitor 103 one electrode of which is connected to the wiring 12 and the other electrode of which is connected to the other electrode of the capacitor 101 may be provided also in any semiconductor device shown in FIGS. 6A, 6B, 8A, 8B, 9A, 9B, and 10A, like the semiconductor devices shown in FIGS. 22A and 22B. Also in that case, an effect similar to that in the semiconductor devices shown in FIGS. 22A and 22B can be attained.

Heretofore, the semiconductor devices whose configurations are different from FIG. 6A are described.

Next, a specific example of the circuit 120 is described.

Figure 10B:
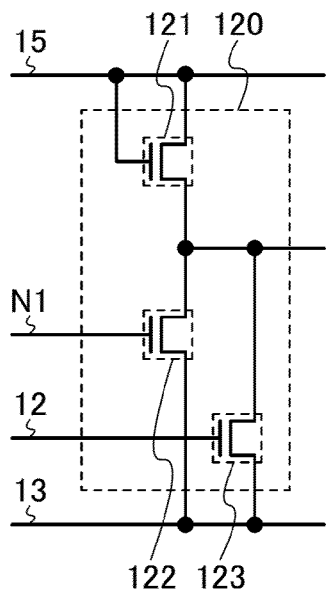

FIG. 10B is a circuit diagram of the circuit 120. The circuit 120 includes a transistor 121, a transistor 122, and a transistor 123. A first terminal of the transistor 121 is connected to the wiring 15, a second terminal of the transistor 121 is connected to the one electrode of the capacitor 101, and a gate of the transistor 121 is connected to the wiring 15. A first terminal of the transistor 122 is connected to the wiring 13, a second terminal of the transistor 122 is connected to the one electrode of the capacitor 101, and a gate of the transistor 122 is connected to the node N1. A first terminal of the transistor 123 is connected to the wiring 13, a second terminal of the transistor 123 is connected to the one electrode of the capacitor 101, and a gate of the transistor 123 is connected to the wiring 12.

The transistor 121 supplies the potential VH of the wiring 15 to the one electrode of the capacitor 101. The transistor 122 supplies the potential VL1 of the wiring 13 to the one electrode of the capacitor 101. The transistor 123 also supplies the potential VL1 of the wiring 13 to the one electrode of the capacitor 101. The timing at which the transistor 122 supplies the potential VL1 of the wiring 13 to the one electrode of the capacitor 101 is controlled by the potential of the node N1. The timing at which the transistor 123 supplies the potential VL1 of the wiring 13 to the one electrode of the capacitor 101 is controlled by the signal SE of the wiring 12.

In the period T0, since the signal SE is at the high level, the transistor 123 is turned on. Consequently, regardless of whether the transistor 122 is on, the potential VL1 of the wiring 13 is supplied to the one electrode of the capacitor 101 through the transistor 123, whereby the signal IN2 becomes a low-level potential.

In the period T1, since the level of the signal SE is changed to the low level, the transistor 123 is turned off. Consequently, in the case where the potential of the node N1 is increased and thus the transistor 122 is turned on, the potential VL1 of the wiring 13 is supplied to the one electrode of the capacitor 101 through the transistor 122, whereby the signal IN2 becomes the low-level potential; in the case where the potential of the node N1 is decreased and thus the transistor 122 is turned off, the potential VL1 of the wiring 13 is not supplied to the one electrode of the capacitor 101, whereby the signal IN2 becomes a high-level potential.

Figure 10C:
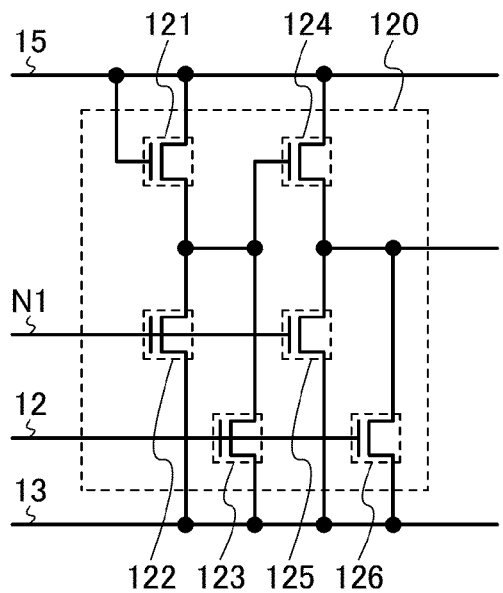

As shown in FIG. 10C, transistors 124, 125, and 126 may be provided in the circuit 120 shown in FIG. 10B. A first terminal of the transistor 124 is connected to the wiring 15, a second terminal of the transistor 124 is connected to the one electrode of the capacitor 101, and a gate of the transistor 124 is connected to the second terminals of the transistors 121, 122, and 123. A first terminal of the transistor 125 is connected to the wiring 13, a second terminal of the transistor 125 is connected to the one electrode of the capacitor 101, and a gate of the transistor 125 is connected to the node N1. A first terminal of the transistor 126 is connected to the wiring 13, a second terminal of the transistor 126 is connected to the one electrode of the capacitor 101, and a gate of the transistor 126 is connected to the wiring 12. In the semiconductor device shown in FIG. 10C, the high-level potential and the low-level potential of the signal IN2 can be increased to VH and VL1, respectively, with a bootstrap operation.

In the circuit 120 shown in FIG. 10C, the wiring 23 may be used instead of the wiring 15. That is, the first terminal of the transistor 121, the gate of the transistor 121, and the first terminal of the transistor 124 may be connected to the wiring 23. In that case, the signal IN2 can be switched between the high level and the low level repeatedly in the period Td. Accordingly, the period during which the transistors 112 and 114 are on can be shortened, whereby degradation of the transistors 112 and 114 can be suppressed.

Heretofore, the specific example of the circuit 120 is described.

In all or part of the period Td, the transistors 112 and 114 are turned on when the signal IN2 is set at the high level. Consequently in that case, the potential of the wiring 13 is supplied to the wiring 16 through the transistor 112 and to the node N1 through the transistor 114. Accordingly, the potentials of the wiring 16 and the node N1 can more surely be kept at VL1 also in the period Td.

This embodiment can be implemented in appropriate combination with any other embodiment and the like.

Embodiment 3

In this embodiment, a shift register in which the semiconductor device described in Embodiment 2 is used as a flip-flop circuit is described. Description is made on portions different from Embodiments 1 and 2.

Figure 11:
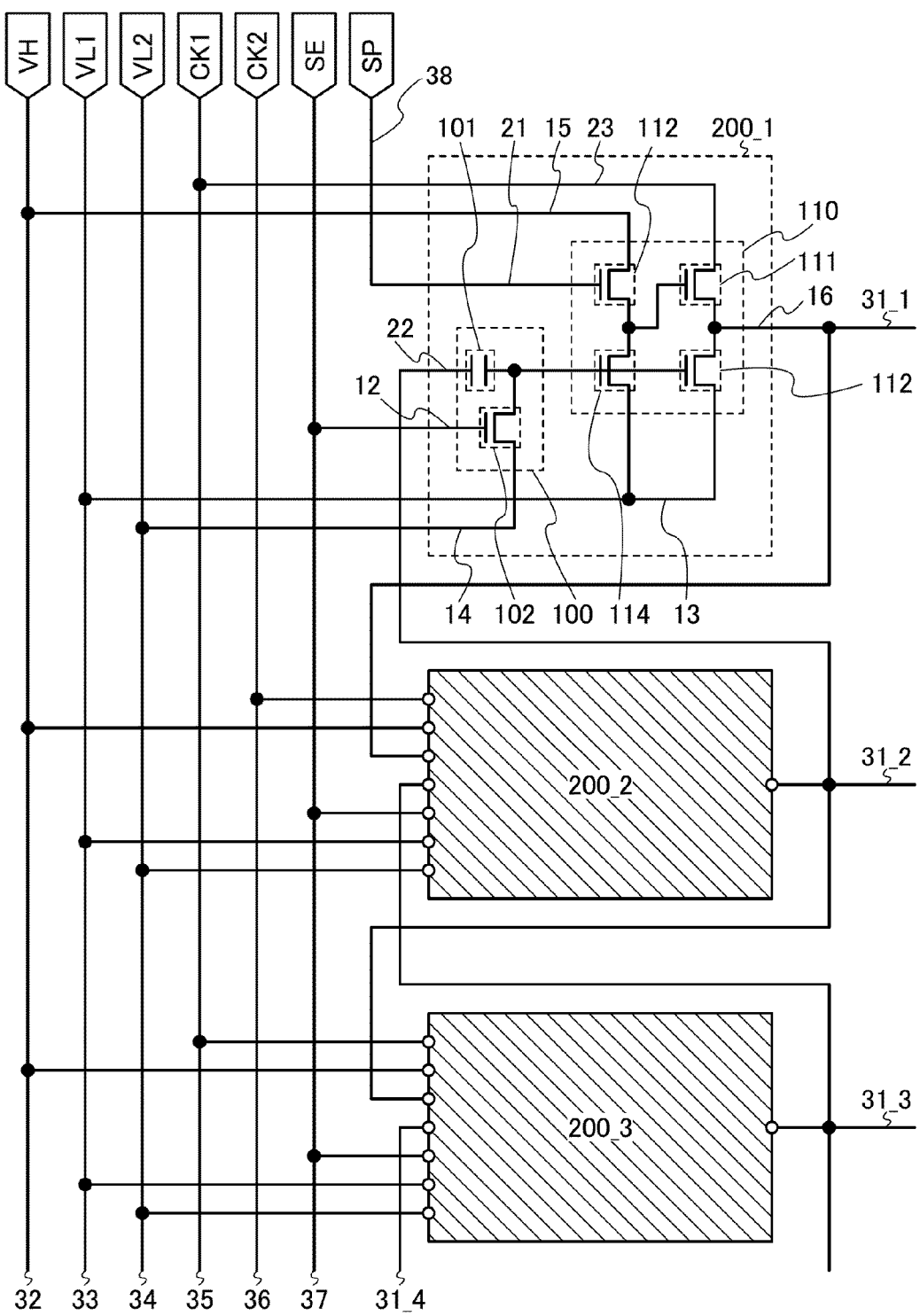
FIG. 11 is a diagram for illustrating a shift register according to one embodiment of the present invention.

The shift register of this embodiment is described with reference to FIG. 11. FIG. 11 is a circuit diagram of the shift register of this embodiment. The shift register in FIG. 11 includes N flip-flop circuits 200 (N is a natural number). Among these, 1st to 3rd stage flip-flop circuits 200 (denoted by a flip-flop circuit 200_1, a flip-flop circuit 200_2, and a flip-flop circuit 200_3) are shown in FIG. 11.

In the shift register shown in FIG. 11, the semiconductor device shown in FIG. 6A is used as the flip-flop circuit 200. However, the flip-flop circuit 200 is not limited to the semiconductor device shown in FIG. 6A and any other semiconductor device described in Embodiment 2 can be used as appropriate.

Connection relations in the shift register circuit shown in FIG. 11 are described. The i-th stage flip-flop circuit 200 (i is any of 2 to (N−1)) is connected to the i-th stage wiring 31 (denoted by a wiring 31_i), the (i−1)th stage wiring 31 (denoted by a wiring 31_(i−1)), the (i+1)th stage wiring 31 (denoted by a wiring 31_(i+1)), a wiring 32, a wiring 33, a wiring 34, one of wirings 35 and 36, and a wiring 37. Specifically, in the i-th stage flip-flop circuit 200, the wiring 16 is connected to the i-th stage wiring 31, the wiring 21 is connected to the (i−1)th stage wiring 31, and the wiring 22 is connected to the (i+1)th stage wiring 31. Further, the wiring 15 is connected to the wiring 32, the wiring 13 is connected to the wiring 33, the wiring 14 is connected to the wiring 34, the wiring 23 is connected to one of the wirings 35 and 36, and the wiring 12 is connected to the wiring 37. The 1st stage flip-flop circuit 200 is different from the i-th stage flip-flop circuit 200 in that the wiring 21 is connected to a wiring 38.

The signal OUT is output from the wiring 31; the wiring 31 transmits the signal OUT.

The potential VH is supplied to the wiring 32, and the wiring 32 transmits the potential VH.

The potential VL1 is supplied to the wiring 33, and the wiring 33 transmits the potential VL1.

The potential VL2 is supplied to the wiring 34, and the wiring 34 transmits the potential VL2.

Signal CK1 is supplied to the wiring 35, and the wiring 35 transmits the signal CK1. Signal CK2 is supplied to the wiring 36, and the wiring 36 transmits the signal CK2. The signals CK1 and CK2 are similar to the signal CK. The signals CK1 and CK2 are signals inverted from each other or signals whose phases are different from each other.

The signal SE is input to the wiring 37, and the wiring 37 transmits the signal SE.

Signal SP is input to the wiring 38, and the wiring 38 transmits the signal SP. The signal SP is a start pulse of the shift register. The signal SP is also a digital signal whose high-level potential is VH and low-level potential is VL1.

Next, an example of a driving method of the shift register shown in FIG. 11 is described with reference to FIG. 12. FIG. 12 is an example of a timing chart for describing the driving method of the shift register shown in FIG. 11. In FIG. 12, the signal OUT of the 1st stage flip-flop circuit 200, the signal OUT of the 2nd stage flip-flop circuit 200, and the signal OUT of the N-th stage flip-flop circuit 200 are denoted by a signal OUT1, a signal OUT2, and a signal OUTN, respectively.

In the period T0, the signal SE is set at the high level. Consequently, each of the 1st to N-th stage flip-flop circuits 200 performs the operation as in the period T0 described in Embodiment 2.

In the period T1, the level of the signal SE is changed to the low level. Consequently, each of the 1st to N-th stage flip-flop circuits 200 performs the operation as in the period T1 described in Embodiment 2. Specifically, when the signal OUT of the (i−1)th stage flip-flop circuit 200 is at the high level, the i-th stage flip-flop circuit 200 performs the operation as in the period Ta described in Embodiment 2, whereby the signal OUT of the i-th stage flip-flop circuit 200 comes to be at the low level. Then, the signals CK1 and CK2 are inverted, and the i-th stage flip-flop circuit 200 performs the operation as in the period Tb described in Embodiment 2, whereby the signal OUT of the i-th stage flip-flop circuit 200 comes to be at the high level. Then, the signals CK1 and CK2 are inverted and the signal OUT of the (i+1)th stage flip-flop circuit 200 is changed to the high level, and the i-th stage flip-flop circuit 200 performs the operation as in the period Tc described in Embodiment 2, whereby the signal OUT of the i-th stage flip-flop circuit 200 comes to be at the low level. Then, until the signal OUT of the (i−1)th stage flip-flop circuit 200 is changed to the high level again, the i-th stage flip-flop circuit 200 keeps performing the operation in the period Td described in Embodiment 2, in which the signal OUT of the i-th stage flip-flop circuit 200 is kept at the low level.

Since the semiconductor device shown in FIG. 6A is used as the flip-flop circuit 200 in the shift register shown in FIG. 11, an effect similar to that in the semiconductor device shown in FIG. 6A can be attained.

Heretofore, the driving method of the shift register shown in FIG. 11 is described.

In the shift register shown in FIG. 11, the wiring 37 can be omitted and the wiring 12 in each flip-flop circuit 200 may be connected to the wiring 38. In this manner, the number of wirings can be reduced. In addition, the offset voltage can be held periodically in the capacitor 101.

In the case where the semiconductor device shown in FIG. 9A is used for the flip-flop circuit 200, the wiring 24 is preferably connected to the wiring 36 when the wiring 23 is connected to the wiring 35. In this manner, an increase in the number of wirings can be suppressed.

In the case where the semiconductor device shown in FIG. 9B is used for the flip-flop circuit 200, it is preferable that the wiring 25 is connected to the wiring 31 and the wiring 16 is connected to a load. In this manner, another stage flip-flop circuit 200 can be driven by the signal OUTB of the wiring 25, which is not affected by the load, whereby the shift register can be driven stably.

This embodiment can be implemented in appropriate combination with any other embodiment and the like.

Embodiment 4

In this embodiment, a display device in which the shift register described in Embodiment 3 is used for a driver circuit is described.

Further, part or whole of the driver circuit can be formed over the same substrate as a pixel portion, whereby a system-on-panel can be obtained.

As a display element used for the display device, a liquid crystal element (also referred to as a liquid crystal display element) or a light-emitting element (also referred to as a light-emitting display element) can be used. The light-emitting element includes in its category, an element whose luminance is controlled by a current or a voltage, and specifically includes an inorganic electroluminescent (EL) element, an organic EL element, and the like. A display medium whose contrast is changed by an electric effect, such as electronic ink, can also be used.

Figure 13A:
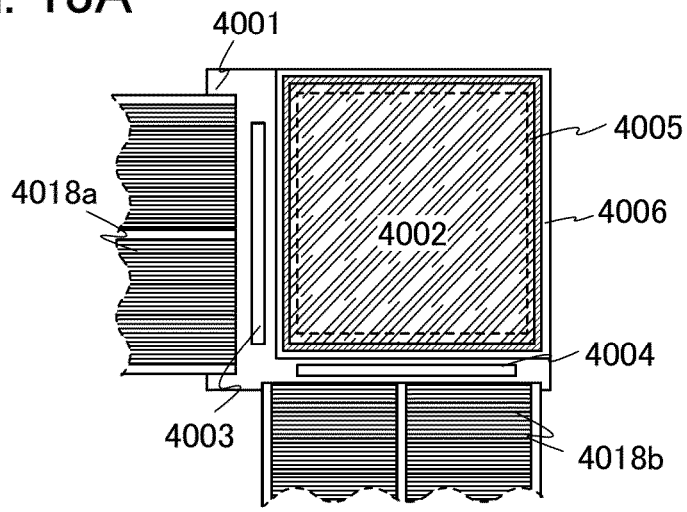
FIGS. 13A to 13C are views for illustrating display devices according to embodiments of the present invention.

In FIG. 13A, a sealant 4005 is provided so as to surround a pixel portion 4002 provided over a first substrate 4001, and the pixel portion 4002 is sealed between the first substrate 4001 and a second substrate 4006. In FIG. 13A, a scan line driver circuit 4004 and a signal line driver circuit 4003 are formed over another substrate and mounted in a region outside a region surrounded by the sealant 4005 over the first substrate 4001. Further, a variety of signals and potentials are supplied to the signal line driver circuit 4003, the scan line driver circuit 4004, and the pixel portion 4002 from flexible printed circuits (FPCs) 4018a and 4018b.

Figure 13B:
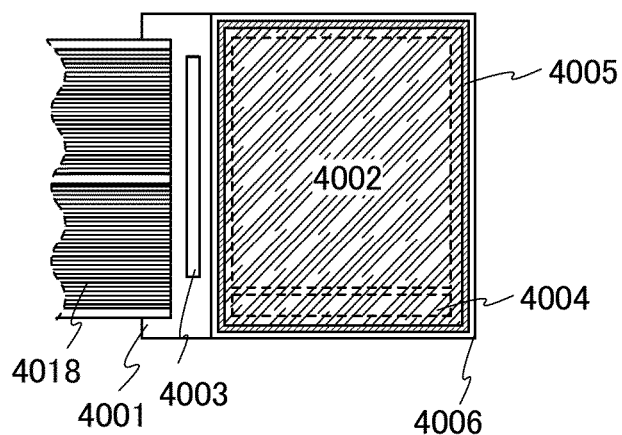
Figure 13C:
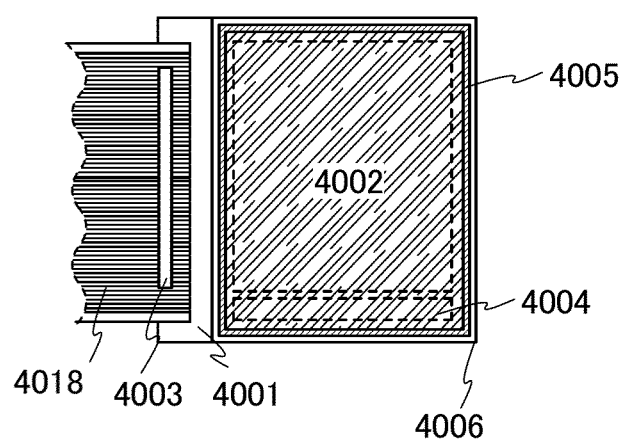

In FIGS. 13B and 13C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with the display element, by the first substrate 4001, the sealing material 4005, and the second substrate 4006. In FIGS. 13B and 13C, the signal line driver circuit 4003 is formed over another substrate and mounted in a region outside a region surrounded by the sealant 4005 over the first substrate 4001. In FIGS. 13B and 13C, a variety of signals and potentials are supplied to the signal line driver circuit 4003, the scan line driver circuit 4004, and the pixel portion 4002 from an FPC 4018.

Although FIGS. 13B and 13C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

A connection method of such a separately formed driver circuit is not particularly limited; a chip on glass (COG) method, a wire bonding method, a tape automated bonding (TAB) method, or the like can be used. FIG. 13A illustrates an example in which the signal line driver circuit 4003 and the scan line driver circuit 4004 are mounted by a COG method; FIG. 13B illustrates an example in which the signal line driver circuit 4003 is mounted by a COG method; FIG. 13C illustrates an example in which the signal line driver circuit 4003 is mounted by a TAB method.

In addition, the display device encompasses a panel in which the display element is sealed, and a module in which an IC or the like including a controller is mounted on the panel.

The display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion provided over the first substrate includes a plurality of transistors.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like is used. Such a liquid crystal material exhibits a cholesteric phase, a smectic phase, a cubic phase, a chiral nematic phase, an isotropic phase, or the like, depending on conditions.

Alternatively, liquid crystal exhibiting a blue phase for which an alignment film is unnecessary may be used. The blue phase is one of liquid crystal phases, which is generated just before a cholesteric phase changes into an isotropic phase while the temperature of the cholesteric liquid crystal is increased. Since the blue phase appears only in a narrow temperature range, a liquid crystal composition in which 5 wt. % or more of a chiral agent is mixed is preferably used for a liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since the alignment film does not need to be provided, rubbing treatment is not necessary. Consequently, electrostatic discharge caused by the rubbing treatment can be prevented and thus defects and damage of the liquid crystal display device in the manufacturing process can be reduced. Accordingly, productivity of the liquid crystal display device can be increased.

The specific resistivity of the liquid crystal material is greater than or equal to $1 \times 10^9$ Ω·cm, preferably greater than or equal to $1 \times 10^{11}$ Ω·cm, further preferably greater than or equal to $1 \times 10^{12}$ Ω·cm. The specific resistivity in this specification is measured at 20° C.

The size of a storage capacitor provided in the liquid crystal display device is set considering the leakage current of the transistor provided in the pixel portion or the like so that charge can be retained for a predetermined period. The size of the storage capacitor may be set considering the off-state current of the transistor or the like.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like is used.

Further, a normally black liquid crystal display device such as a transmissive liquid crystal display device utilizing a vertical alignment (VA) mode may be formed. Some examples are given as the vertical alignment mode; for example, a multi-domain vertical alignment (MVA) mode, a patterned vertical alignment (PVA) mode, an ASV mode, or the like can be used.

This embodiment can also be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization with a polarizing substrate and a retardation substrate may be used. In addition, a backlight, a side light, or the like may be used as a light source.

As a display method in the pixel portion, a progressive method, an interlace method, or the like can be used. Further, color elements controlled in a pixel for color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the size of a display region may be different between respective dots of color elements. The present invention is not limited to the application to a display device for color display; one embodiment of the present invention can be applied to a display device for monochrome display.

Alternatively, as the display element included in the display device, a light-emitting element utilizing electroluminescence can be used. Light-emitting elements utilizing electroluminescence are classified according to whether the light-emitting material is an organic compound or an inorganic compound. In general, the former is referred to as an organic EL element, and the latter is referred to as an inorganic EL element.

In the organic EL element, by application of voltage to the light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. The light-emitting element is called a current-excitation light-emitting element after such a mechanism.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be shaped thin and light.

Although the electrophoretic display device can have various modes, the electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. The first particle and the second particle each contain pigment and do not move without an electric field. Further, the first particle and the second particle have different colors (one of them may be colorless).

Thus, the electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, the electronic ink also enables color display with a color filter or particles that have a pigment.

The first particle and the second particle in the microcapsules may be formed using a single material selected from a conductive material, an insulating material, a semiconductor material, a magnetic material, a liquid crystal material, a ferroelectric material, an electroluminescent material, an electrochromic material, or a magnetophoretic material or formed using a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The shift register described in Embodiment 3 can be applied to the display device described in this embodiment, whereby a display device which can operate stably even if the transistor is a depletion transistor can be provided.

This embodiment can be implemented in appropriate combination with any other embodiment and the like.

Embodiment 5

In this embodiment, a transistor applicable to any of the semiconductor devices described in Embodiments 1 and 2, the shift register described in Embodiment 3, and the display device described in Embodiment 4 is described.
<Oxide Semiconductor>

An oxide semiconductor is described below in detail.

An oxide semiconductor to be used preferably contains at least indium (In) or zinc (Zn). In particular, In and Zn are preferably contained. As a stabilizer for reducing variation in electric characteristics of a transistor using the oxide semiconductor, gallium (Ga) is preferably further contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

An In—Ga—Zn-based oxide semiconductor material has sufficiently high resistance when there is no electric field and thus has a sufficiently low off-state current. In addition, the In—Ga—Zn-based oxide semiconductor material has a high field-effect mobility. Further, in a transistor using an In—Sn—Zn-based oxide semiconductor material, the field-effect mobility can be three times or more as high as that of a transistor using the In—Ga—Zn-based oxide semiconductor material, and the threshold voltage is likely to be positive. These semiconductor materials are appropriate examples of a material that can be used for a transistor included in a semiconductor device according to one embodiment of the present invention For example, the "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ ($m>0$ and m≠an integer) may be used as the oxide semiconductor. Note that M represents one or more metal elements selected from Ga, Fe, Mn, and Co. Further alternatively, as the oxide semiconductor, a material represented by $In_3SnO_5(ZnO)_n$ ($n>0$ and n=an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used depending on needed semiconductor characteristics (e.g., mobility, threshold voltage, and variation). In order to realize the needed semiconductor characteristics, it is preferable that the carrier density, the impurity concentration, the defect density, the atomic ratio between a metal element and oxygen, the interatomic distance, the density, and the like be set to appropriate values.

For example, a high mobility can be provided relatively easily with the In—Sn—Zn-based oxide, whereas the mobility can be increased by reducing the defect density in the bulk also with the In—Ga—Zn-based oxide.

For example, the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1) means that a, b, and c satisfy the following relation: $(a-A)^2+(b-B)^2+(c-C)^2 \leq r^2$, and r may be 0.05, for example. The same can be applied to other oxides.

Further, it is preferable that impurities such as moisture and hydrogen, which form an electron donor (donor), be reduced, so that an oxide semiconductor layer can be highly purified. Specifically, the concentration of hydrogen in the highly-purified oxide semiconductor layer that is measured by secondary ion mass spectrometry (SIMS) is $5 \times 10^{19}/cm^3$ or less, preferably $5 \times 10^{18}/cm^3$ or less, further preferably $5 \times 10^{17}/cm^3$ or less, still further preferably $1 \times 10^{16}/cm^3$ or less. The carrier density of the oxide semiconductor layer measured by Hall effect measurement is less than $1 \times 10^{14}/cm^3$, preferably less than $1 \times 10^{12}/cm^3$, further preferably less than $1 \times 10^{11}/cm^3$.

Here, an analysis on the hydrogen concentration of the oxide semiconductor layer is mentioned. The hydrogen concentration of the semiconductor layer is measured by secondary ion mass spectrometry. It is known that it is difficult, in principle, to obtain correct data in the proximity of a top surface of a sample or in the proximity of an interface between stacked layers formed of different materials by the SIMS analysis. Thus, in the case where the distribution of the concentration of hydrogen in the layer in a thickness direction is analyzed by SIMS, an average value is obtained in a region of the layer in which the concentration is not greatly changed and is kept substantially the same value, and is employed as the hydrogen concentration. However, in the case where the thickness of the layer is small, such a region where the concentration is kept substantially the same value cannot be found in some cases due to the influence of the concentration of hydrogen in an adjacent layer. In that case, the maximum value or the minimum value of the hydrogen concentration in the region of the layer is employed as the hydrogen concentration of the layer. Further, in the case where a mountain-shaped peak having the maximum value or a valley-shaped peak having the minimum value does not appear in the region of the layer, the value at an inflection point is employed as the hydrogen concentration.

In the case where the oxide semiconductor layer is formed by a sputtering method, it is important to reduce not only the hydrogen concentration of a target but also water and hydrogen in a chamber, as much as possible. Specifically, the following are effective: inside of the chamber is baked before the deposition; the water and hydrogen concentrations in a gas introduced in the chamber are reduced; and counter flow of an exhaust system, from which a gas in the chamber is exhausted, is prevented.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and thus relatively high mobility can be obtained with relative ease.

On the other hand, in an oxide semiconductor having crystallinity, defects in the bulk can be further reduced and when the surface flatness is improved, mobility higher than that of the oxide semiconductor layer in an amorphous state can be obtained. To improve the surface flatness, the oxide semiconductor is preferably formed on a flat surface; specifically, the oxide semiconductor may be formed on a surface with an average surface roughness (Ra) of less than or equal to 1 nm, preferably less than or equal to 0.3 nm, further preferably less than or equal to 0.1 nm.

Note that $R_a$ is obtained by three-dimension expansion of a center line average roughness that is defined by JIS B 0601 so as to be applied to a plane, and can be expressed as an "average value of the absolute values of deviations from a reference surface to a specified surface" and is defined by the formula below.

$$Ra = \frac{1}{S_0}\int_{y_1}^{y_2}\int_{x_1}^{x_2}|f(x,y)-Z_0|dxdy \qquad \text{[FORMULA 1]}$$

In the above formula, $S_0$ represents the area of a plane to be measured (a rectangular region which is defined by four points at coordinates $(x_1, y_1)$, $(x_1, y_2)$, $(x_2, y_1)$, and $(x_2, y_2)$), and $Z_0$ represents the average height of the plane to be measured. The average surface roughness Ra can be measured with an atomic force microscope (AFM).

The oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not either complete single crystal or complete amorphous. The CAAC-OS film is an oxide semiconductor film with a crystal-amorphous mixed phase structure where crystal parts and amorphous parts are included in an amorphous phase. Note that in many cases, the crystal part has a size fits inside a cube whose side is less than 100 nm. From an observation image obtained with a transmission electron microscope (TEM), a boundary between the amorphous part and the crystal part in the CAAC-OS film is not clear. Further, with the TEM, a grain boundary in the CAAC-OS film is not found; thus, in the CAAC-OS film, a decrease in electron mobility due to the grain boundary is suppressed.

In each of the crystal parts included in the CAAC-OS film, a c-axis is aligned in a direction parallel to a normal vector of a surface where the CAAC-OS film is formed or a normal vector of a top surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. The directions of the a-axis and the b-axis of the crystal part may be different among the crystal parts. In this specification, the simple expression "perpendicular" encompasses a range from 85° to 95°; the simple expression "parallel" encompasses a range from −5° to 5°.

In the CAAC-OS film, distribution of the crystal parts is not necessarily uniform. For example, in the case where crystal growth proceeds from a top surface side of the oxide semiconductor film in forming the CAAC-OS film, the proportion of crystal parts in the vicinity of the top surface of the oxide semiconductor film is higher than that in the vicinity of the surface where the oxide semiconductor film is formed in some cases. Further, in the case where an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the top surface of the CAAC-OS film, the directions of the c-axes may be different from each other depending on the shape of the CAAC-OS film (the cross-sectional shape of the surface where the CAAC-OS film is formed or the cross-sectional shape of the top surface of the CAAC-OS film). The direction of the c-axis of the crystal part is the direction parallel to the normal vector of the surface where the CAAC-OS film is formed or the normal vector of the top surface of the CAAC-OS film as it is deposited. The crystal part is formed by deposition or by performing treatment for crystallization such as heat treatment after deposition.

With the use of the CAAC-OS film in the transistor, change in the electric characteristics of the transistor due to irradiation with visible light or ultraviolet light can be decreased. Thus, the transistor has high reliability.

Part of oxygen included in the oxide semiconductor film may be substituted with nitrogen.

Note that the proportion of oxygen gas in an atmosphere is preferably high when the CAAC-OS film is deposited by a sputtering method. For example, in the case of a sputtering method in a mixed gas atmosphere of argon and oxygen, the proportion of oxygen gas is preferably 30% or more, further preferably 40% or more. This is because oxygen is supplied from the atmosphere and promotes the crystallization of the CAAC.

Further, in the case where the CAAC-OS film is deposited by a sputtering method, a substrate over which the CAAC-OS film is deposited is preferably heated to 150° C. or higher, further preferably to 170° C. or higher. This is because the higher the substrate temperature is, the more the crystallization of the CAAC is promoted.

Further, after being subjected to heat treatment in a nitrogen atmosphere or in vacuum, the CAAC-OS film is preferably subjected to heat treatment in an oxygen atmosphere or a mixed atmosphere of oxygen and another gas. This is because oxygen vacancies due to the former heat treatment can be repaired by oxygen supplied from the atmosphere in the latter heat treatment.

Further, the film surface on which the CAAC-OS film (deposition surface) is deposited is preferably flat. This is because roughness of the deposition surface leads to generation of grain boundaries in the CAAC-OS film because the c-axis approximately perpendicular to the deposition surface exists in the CAAC-OS film. For this reason, the deposition surface is preferably subjected to planarization such as chemical mechanical polishing (CMP) before the CAAC-OS film is deposited. The average roughness of the deposition surface is preferably 0.5 nm or less, further preferably 0.3 nm or less.

Next, examples of a crystal structure of the CAAC-OS film are described in detail with reference to FIGS. 14A to 14E, FIGS. 15A to 15C, and FIGS. 16A to 16C. Unless otherwise specified, the upward direction corresponds to the c-axis direction and a plane perpendicular to the c-axis direction corresponds to the a-b plane in FIGS. 14A to 14E, FIGS. 15A to 15C, and FIGS. 16A to 16C. The simple expressions of "upper half" and "lower half" refer to an upper half above the a-b plane and a lower half below the a-b plane (an upper half and a lower half with respect to the a-b plane), respectively.

Further, in FIGS. 14A to 14E, circled O surrounded represents tetracoordinate O and double-circled O represents tricoordinate O.

Figure 14A:
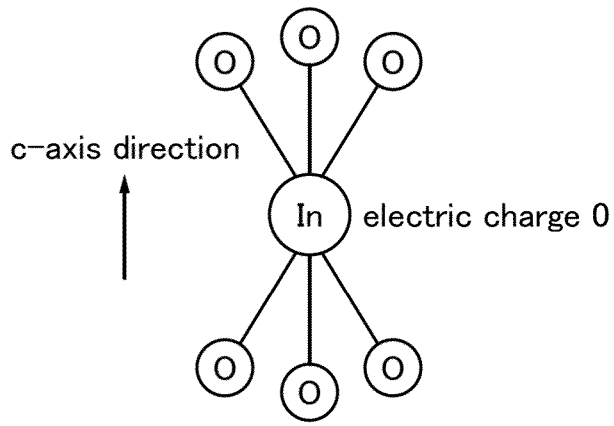
FIGS. 14A to 14E are diagrams illustrating structures of oxide materials according to embodiments of the present invention.

FIG. 14A illustrates a structure including one hexacoordinate In atom and six tetracoordinate oxygen atoms (hereinafter referred to as tetracoordinate O) proximate to the In atom. Here, a structure including one metal atom and oxygen atoms proximate thereto is referred to as a small group. The structure in FIG. 14A is actually an octahedral structure, but is illustrated as a planar structure for simplicity. Note that three tetracoordinate O exist in each of an upper half and a lower half in FIG. 14A. Electric charge of the small group illustrated in FIG. 14A is 0.

Figure 14D:
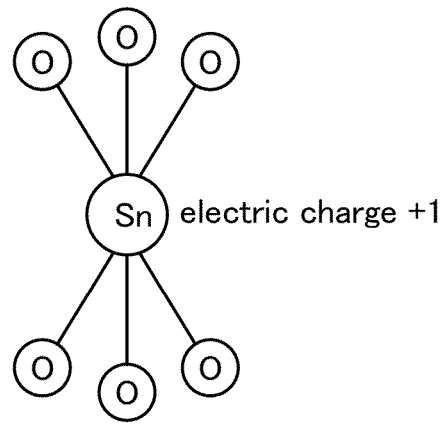
Figure 14B:
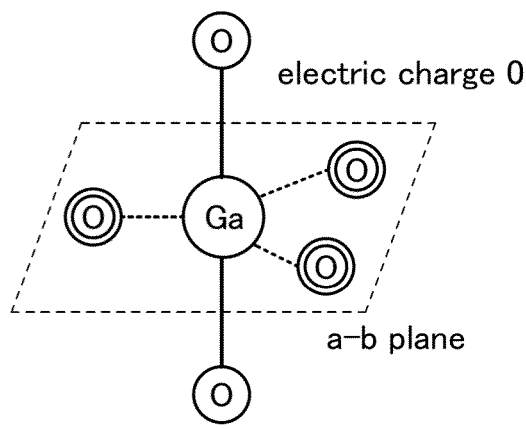

FIG. 14B illustrates a structure including one pentacoordinate Ga, three tricoordinate oxygen atoms (hereinafter referred to as tricoordinate O) proximate to the Ga, and two tetracoordinate O proximate to the Ga. All the tricoordinate O exist on the a-b plane. One tetracoordinate O exists in each of an upper half and a lower half in FIG. 14B. An In atom can also have the structure illustrated in FIG. 14B because the In can have five ligands. Electric charge of the small group illustrated in FIG. 14B is 0.

Figure 14E:
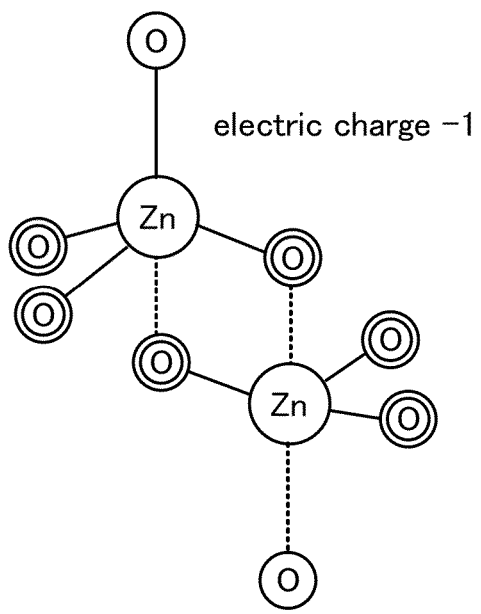
Figure 14C:
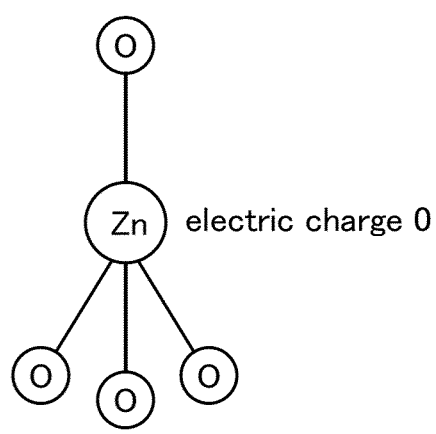

FIG. 14C illustrates a structure including one tetracoordinate Zn and four tetracoordinate O proximate to the Zn. In FIG. 14C, one tetracoordinate O exists in an upper half and three tetracoordinate O exist in a lower half; alternatively, three tetracoordinate O may exist in the upper half and one tetracoordinate O may exist in the lower half. Electric charge of the small group illustrated in FIG. 14C is 0.

FIG. 14D illustrates a structure including one hexacoordinate Sn and six tetracoordinate O proximate to the Sn atom. In FIG. 14D, three tetracoordinate O exist in each of an upper half and a lower half. Electric charge of the small group illustrated in FIG. 14D is +1.

FIG. 14E illustrates a small group including two Zn. In FIG. 14E, one tetracoordinate O exists in each of an upper half and a lower half. Electric charge of the small group illustrated in FIG. 14E is −1.

Here, a plurality of small groups is collectively referred to a medium group, and a plurality of medium groups is collectively referred to as a large group (also referred to as a unit cell).

Here, a rule of bonding between the small groups is described below. In FIG. 14A, the three O in the upper half with respect to the hexacoordinate In each have three proximate In in the downward direction, and the three O in the lower half each have three proximate In in the upward direction. In FIG. 14B, the one O in the upper half with respect to the pentacoordinate Ga has one proximate Ga in the downward direction, and the one O in the lower half has one proximate Ga in the upward direction. In FIG. 14C, the one O in the upper half with respect to the tetracoordinate Zn has one proximate Zn in the downward direction, and the three O in the lower half each have three proximate Zn in the upward direction. In this manner, the number of tetracoordinate O in the upper half with respect to a metal atom is equal to the number of metal atoms proximate thereto in the downward direction, and the number of tetracoordinate O in the lower half with respect to the metal atom is equal to the number of metal atoms proximate thereto in the upward direction. Since the coordination number of the tetracoordinate O is 4, the sum of the number of the proximate metal atoms in the downward direction and the number of the proximate metal atoms in the upward direction is 4. Accordingly, when the sum of the number of tetracoordinate O in the upper half with respect to a metal atom and the number of tetracoordinate O in the lower half with respect to another metal atom is 4, the two small groups including the metal atoms can be bonded. The reason is described below. For example, in the case where the hexacoordinate metal (In or Sn) atom is bonded through three tetracoordinate O in the lower half with respect to the hexacoordinate metal atom, the hexacoordinate metal atom is bonded to a pentacoordinate metal (Ga or In) atom or a tetracoordinate metal (Zn) atom.

A metal atom whose coordination number is 4, 5, or 6 is bonded to another metal atom through tetracoordinate O in the c-axis direction. In addition to the above, a medium group can be formed by bonding a plurality of small groups so that the total electric charge of the layered structure is 0.

Figure 15A:
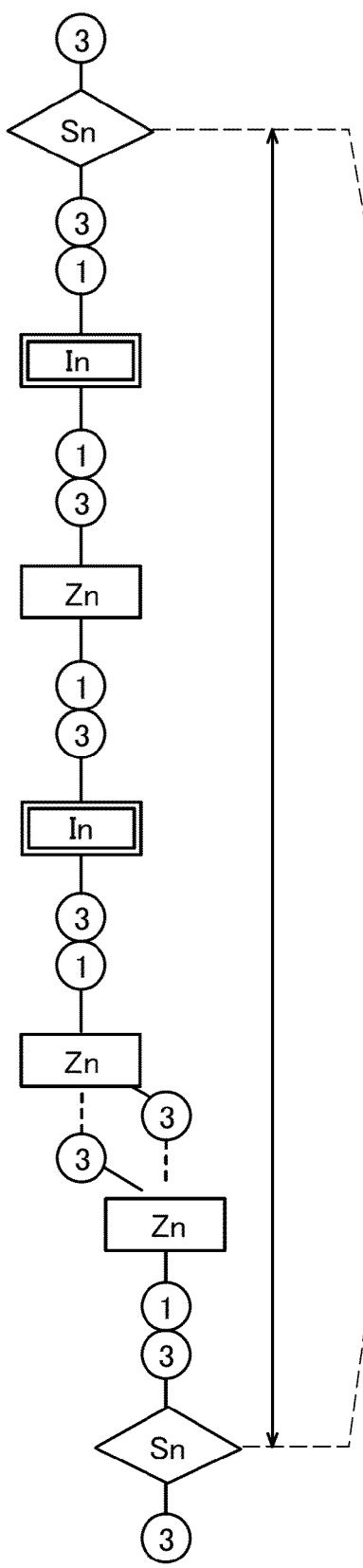
FIGS. 15A to 15C are diagrams illustrating a structure of an oxide material according to one embodiment of the present invention.
Figure 15B:
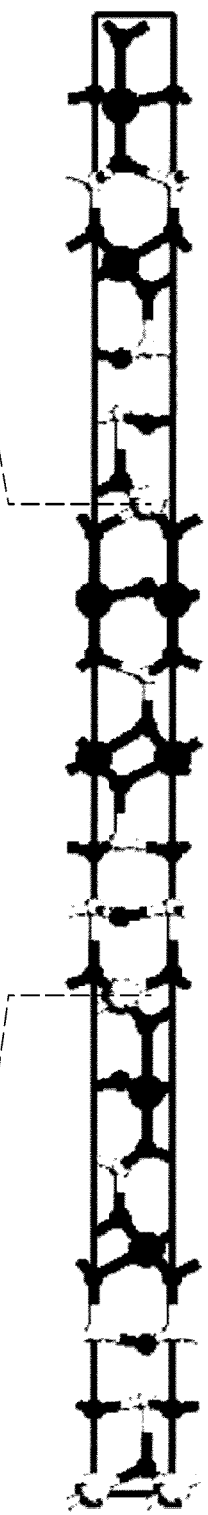
Figure 15C:
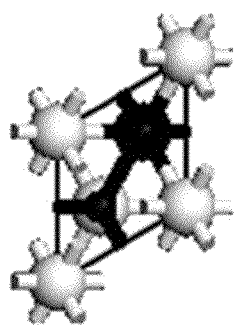

FIG. 15A illustrates a model of a medium group included in a layered structure of an In—Sn—Zn—O-based system. FIG. 15B illustrates a large group consisting of three medium groups. FIG. 15C illustrates an atomic arrangement in the layered structure in FIG. 15B when observed from the c-axis direction.

In FIG. 15A, tricoordinate O is omitted for simplicity, and with respect to tetracoordinate O, only the number thereof is illustrated; for example, three tetracoordinate O existing in each of an upper half and a lower half with respect to Sn are denoted by circled 3. Similarly, in FIG. 15A, one tetracoordinate O existing in each of an upper half and a lower half with respect to In is denoted by circled 1. FIG. 15A also illustrates Zn proximate to one tetracoordinate O in the lower half and three tetracoordinate O in the upper half, and Zn proximate to one tetracoordinate O atom in the upper half and three tetracoordinate O in the lower half.

In the medium group included in the layered structure of the In—Sn—Zn—O-based system in FIG. 15A, in the order starting from the top, Sn proximate to three tetracoordinate O in each of the upper half and the lower half is bonded to In proximate to one tetracoordinate O in each of the upper half and the lower half, the In is bonded to Zn proximate to three tetracoordinate O in the upper half, the Zn is bonded to In proximate to three tetracoordinate O in each of the upper half and the lower half through one tetracoordinate O in the lower half with respect to the Zn, the In is bonded to a small group that includes two Zn atoms and is proximate to one tetracoordinate O in the upper half, and the small group is bonded to Sn proximate to three tetracoordinate O in each of the upper half and the lower half through one tetracoordinate O in the lower half with respect to the small group. A plurality of such medium groups is bonded to constitute the large group.

Here, electric charge for one bond of one tricoordinate O and electric charge for one bond of one tetracoordinate O can be assumed to be −0.667 and −0.5, respectively. For example, electric charge of (hexacoordinate or pentacoordinate) In, electric charge of (tetracoordinate) Zn, and electric charge of (pentacoordinate or hexacoordinate) Sn are +3, +2, and +4, respectively. Accordingly, electric charge in a small group including Sn is +1. Therefore, electric charge of −1, which cancels +1, is needed to form a layered structure including Sn. As a structure having electric charge of −1, the small group including two Zn as illustrated in FIG. 14E can be given. For example, with one small group including two Zn, electric charge of one small group including Sn can be cancelled, so that the total electric charge of the layered structure can become 0.

An In—Sn—Zn—O-based crystal ($In_2SnZn_3O_8$) can be obtained by repeating the large group illustrated in FIG. 15B. A layered structure of the In—Sn—Zn—O-based crystal thus obtained can be expressed as a composition formula, $In_2SnZn_2O_7(ZnO)_m$ (m is 0 or a natural number).

The above-described rule also applies to the following oxides: a four-component metal oxide, such as an In—Sn—Ga—Zn-based oxide; a three-component metal oxide, such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 16A:
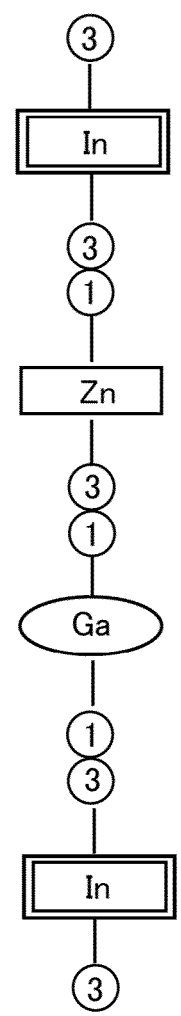
FIGS. 16A to 16C are diagrams illustrating a structure of an oxide material according to one embodiment of the present invention.

As an example, FIG. 16A illustrates a model of a medium group included in a layered structure of an In—Ga—Zn—O-based system.

In the medium group included in the layered structure of the In—Ga—Zn—O-based system in FIG. 16A, in the order starting from the top, In proximate to three tetracoordinate O in each of the upper half and the lower half is bonded to Zn proximate to one tetracoordinate O in the upper half, the Zn is bonded to Ga proximate to one tetracoordinate O in each of the upper half and the lower half through three tetracoordinate O in the lower half with respect to the Zn, and the Ga is bonded to In proximate to three tetracoordinate O in each of the upper half and the lower half through one tetracoordinate O in the lower half with respect to the Ga. A plurality of such medium groups is bonded to constitute.

Figure 16B:
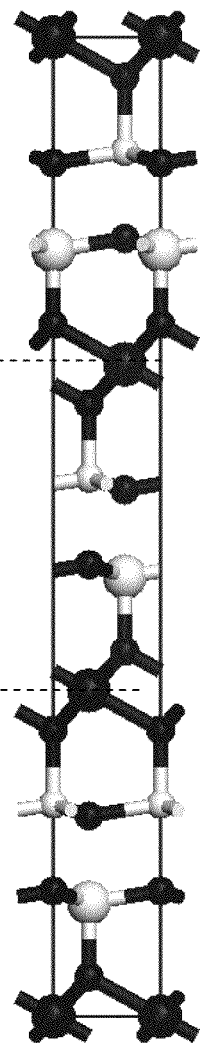
Figure 16C:
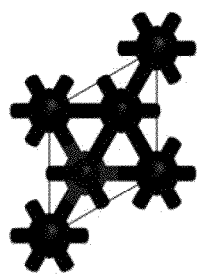

FIG. 16B illustrates a large group consisting of three medium groups. FIG. 16C illustrates an atomic arrangement in the layered structure in FIG. 16B when observed from the c-axis direction.

Here, electric charge of (hexacoordinate or pentacoordinate) In, electric charge of (tetracoordinate) Zn, and electric charge of (pentacoordinate) Ga are +3, +2, +3, respectively, and thus electric charge of a small group including any of In, Zn, and Ga becomes 0. As a result, the total electric charge of a medium group consisting of a combination of such small groups is always 0.

In order to form the layered structure of the In—Ga—Zn—O-based system, a large group may also be formed using a medium group in which the arrangement of In, Ga, and Zn is different from that in FIG. 16A.

<Transistor Whose Channel is Formed in Oxide Semiconductor Layer>

A transistor whose channel is formed in an oxide semiconductor layer is described with reference to FIGS. 17A to 17D. FIGS. 17A to 17D are schematic cross-sectional views each illustrating an example of the structure of the transistor.

Figure 17A:
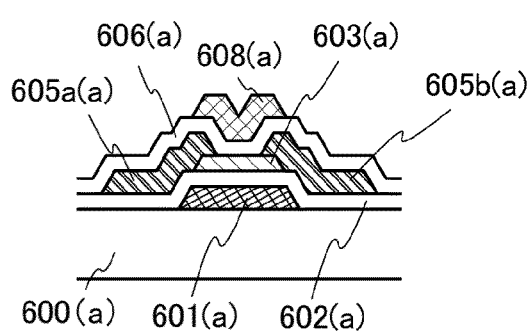
FIGS. 17A to 17D are diagrams illustrating structures of transistors according to embodiments of the present invention.

The transistor illustrated in FIG. 17A includes a conductive layer $601(a)$, an insulating layer $602(a)$, an oxide semiconductor layer $603(a)$, a conductive layer $605a(a)$, a conductive layer $605b(a)$, an insulating layer $606(a)$, and a conductive layer $608(a)$.

The conductive layer $601(a)$ is provided over an element formation layer $600(a)$.

The insulating layer $602(a)$ is provided over the conductive layer $601(a)$.

The oxide semiconductor layer $603(a)$ overlaps with the conductive layer $601(a)$ with the insulating layer $602(a)$ provided therebetween.

The conductive layer 605a(a) and the conductive layer 605b(a) are provided over the oxide semiconductor layer 603(a) and are electrically connected to the oxide semiconductor layer 603(a).

The insulating layer 606(a) is provided over the oxide semiconductor layer 603(a), the conductive layer 605a(a), and the conductive layer 605a(b).

The conductive layer 608(a) overlaps with the oxide semiconductor layer 603(a) with the insulating layer 606(a) provided therebetween.

Both of the conductive layer 601(a) and the conductive layer 608(a) is not necessarily provided. When the conductive layer 608(a) is not provided, the insulating layer 606(a) is not necessarily provided.

Figure 17C:
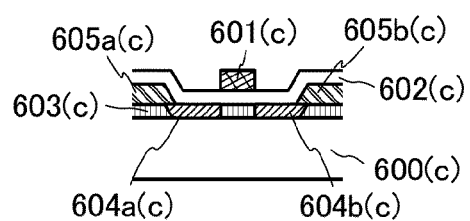
Figure 17B:
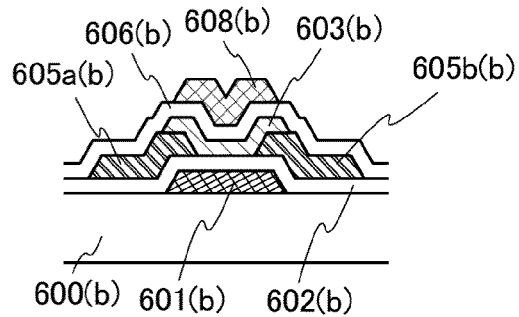

The transistor illustrated in FIG. 17B includes a conductive layer 601(b), an insulating layer 602(b), an oxide semiconductor layer 603(b), a conductive layer 605a(b), a conductive layer 605b(b), an insulating layer 606(b), and a conductive layer 608(b).

The conductive layer 601(b) is provided over an element formation layer 600(b).

The insulating layer 602(b) is provided over the conductive layer 601(b).

The conductive layer 605a(b) and the conductive layer 605b(b) are each provided over part of the insulating layer 602(b).

The oxide semiconductor layer 603(b) is provided over the conductive layer 605a(b) and the conductive layer 605b(b), and is electrically connected to the conductive layer 605a(b) and the conductive layer 605b(b). The oxide semiconductor layer 603(b) overlaps with the conductive layer 601(b) with the insulating layer 602(b) provided therebetween.

The insulating layer 606(b) is provided over the oxide semiconductor layer 603(b), the conductive layer 605a(b), and the conductive layer 605b(b).

The conductive layer 608(b) overlaps with the oxide semiconductor layer 603(b) with the insulating layer 606(b) provided therebetween.

Both of the conductive layer 601(b) and the conductive layer 608(b) is not necessarily provided. When the conductive layer 608(b) is not provided, the insulating layer 606(b) is not necessarily provided.

The transistor illustrated in FIG. 17C includes a conductive layer 601(c), an insulating layer 602(c), an oxide semiconductor layer 603(c), a conductive layer 605a(c), and a conductive layer 605b(c).

The oxide semiconductor layer 603(c) includes a region 604a(c) and a region 604b(c). The region 604a(c) and the region 604b(c) are provided apart from each other and dopants are added thereto. A region between the region 604a(c) and the region 604b(c) is a channel formation region. The oxide semiconductor layer 603(c) is provided over an element formation layer 600(c). The region 604a(c) and the region 604b(c) are not necessarily provided.

The conductive layer 605a(c) and the conductive layer 605b(c) are provided over and electrically connected to the oxide semiconductor layer 603(c). The sides of the conductive layer 605a(c) and the conductive layer 605b(c) are tapered.

The conductive layer 605a(c) overlaps with part of the region 604a(c); however, one embodiment of the present invention is not limited thereto. Overlap between the conductive layer 605a(c) and part of the region 604a(c) can lead to a reduction in the resistance between the conductive layer 605a(c) and the region 604a(c). An entire region of the oxide semiconductor layer 603(c) which overlaps with the conductive layer 605a(c) may form the region 604a(c).

The conductive layer 605b(c) overlaps with part of the region 604b(c); however, one embodiment of the present invention is not limited thereto. Overlap between the conductive layer 605b(c) and part of the region 604b(c) can lead to a reduction in the resistance between the conductive layer 605b(c) and the region 604b(c). An entire region of the oxide semiconductor layer 603(c) which overlaps with the conductive layer 605b(c) may form the region 604b(c).

The insulating layer 602(c) is provided over the oxide semiconductor layer 603(c), the conductive layer 605a(c), and the conductive layer 605b(c).

The conductive layer 601(c) overlaps with the oxide semiconductor layer 603(c) with the insulating layer 602(c) provided therebetween. A region of the oxide semiconductor layer 603(c) which overlaps with the conductive layer 601(c) with the insulating layer 602(c) provided therebetween is a channel formation region.

Figure 17D:
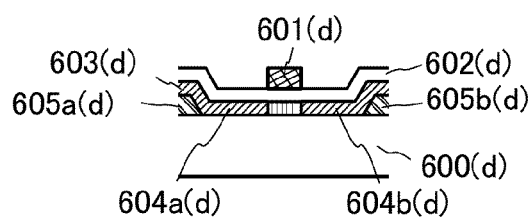

The transistor illustrated in FIG. 17D includes a conductive layer 601(d), an insulating layer 602(d), an oxide semiconductor layer 603(d), a conductive layer 605a(d), and a conductive layer 605b(d).

The conductive layer 605a(d) and the conductive layer 605b(d) are provided over an element formation layer 600(d). The sides of the conductive layer 605a(d) and the conductive layer 605b(d) are tapered.

The oxide semiconductor layer 603(d) includes a region 604a(d) and a region 604b(d). The region 604a(d) and the region 604b(d) are provided apart from each other and dopants are added thereto. A region between the region 604a(d) and the region 604b(d) is a channel formation region. For example, the oxide semiconductor layer 603(d) is provided over the conductive layer 605a(d), the conductive layer 605b(d), and the element formation layer 600(d), and is electrically connected to the conductive layer 605a(d) and the conductive layer 605b(d). The region 604a(d) and the region 604b(d) are not necessarily provided.

The region 604a(d) is electrically connected to the conductive layer 605a(d).

The region 604b(d) is electrically connected to the conductive layer 605b(d).

The insulating layer 602(d) is provided over the oxide semiconductor layer 603(d).

The conductive layer 601(d) overlaps with the oxide semiconductor layer 603(d) with the insulating layer 602(d) provided therebetween. A region of the oxide semiconductor layer 603(d) which overlaps with the conductive layer 601(d) with the insulating layer 602(d) provided therebetween is a channel formation region.

Next, each component illustrated in FIGS. 17A to 17D is described.

An insulating layer, a substrate having an insulating surface, or the like can be used as the element formation layer 600(a), 600(b), 600(c), 600(d). Further, a layer over which an element is formed in advance can also be used as the element formation layer 600(a), 600(b), 600(c), 600(d).

The conductive layer 601(a), 601(b), 601(c), 601(d) functions as a gate of the transistor. A layer functioning as the gate of the transistor can be also referred to as a gate electrode or a gate wiring.

As the conductive layer 601(a), 601(b), 601(c), 601(d), it is possible to use, for example, a layer of a metal material such as molybdenum, magnesium, titanium, chromium, tantalum, tungsten, aluminum, copper, neodymium, or scandium or an alloy material containing any of these materials as a main component. The conductive layer 601(a), 601(b), 601(c), 601

(d) can also be formed by stacking layers of materials which can be applied to the conductive layer 601(a), 601(b), 601(c), 601(d).

The insulating layer 602(a), 602(b), 602(c), 602(d) functions as a gate insulating layer of the transistor.

As the insulating layer 602(a), 602(b), 602(c), 602(d), it is possible to use, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. The insulating layer 602(a), 602(b), 602(c), 602(d) can also be formed by stacking layers of materials which can be applied to the insulating layer 602(a), 602(b), 602(c), 602(d).

Alternatively, as the insulating layer 602(a), 602(b), 602(c), 602(d), an insulating layer of a material containing an element that belongs to Group 13 of the periodic table and oxygen can be used, for example. For example, in the case where the oxide semiconductor layer 603(a), 603(b), 603(c), 603(d) contain an element belonging to Group 13, an insulating layer containing an element belonging to Group 13 can be used as an insulating layer which is in contact with the oxide semiconductor layer 603(a), 603(b), 603(c), 603(d), whereby an interface state between the insulating layer and the oxide semiconductor layer can be improved.

Examples of the material containing an element that belongs to Group 13 and oxygen include gallium oxide, aluminum oxide, aluminum gallium oxide, and gallium aluminum oxide. Aluminum gallium oxide refers to a substance in which the amount of aluminum is larger than that of gallium in atomic percent, and gallium aluminum oxide refers to a substance in which the amount of gallium is larger than or equal to that of aluminum in atomic percent. For example, a material represented by $Al_2O_x$ (x=3+α, where α is larger than 0 and smaller than 1), $Ga_2O_x$ (x=3+α, where α is larger than 0 and smaller than 1), or $Ga_xAl_{2-x}O_{3+α}$ (x is larger than 0 and smaller than 2 and α is larger than 0 and smaller than 1) can be used.

The insulating layer 602(a), 602(b), 602(c), 602(d) can also be formed by stacking layers of materials which can be applied to the insulating layer 602(a), 602(b), 602(c), 602(d). For example, the insulating layer 602(a), 602(b), 602(c), 602(d) can be formed of stacked layers containing gallium oxide represented by $Ga_2O_x$. Further, the insulating layer 602(a), 602(b), 602(c), 602(d) may be formed of a stack of an insulating layer containing gallium oxide represented by $Ga_2O_x$ and an insulating layer containing aluminum oxide represented by $Al_2O_x$.

Further, when the channel length of the transistor is 30 nm, the thickness of the oxide semiconductor layer 603(a), 603(b), 603(c), 603(d) may be about 5 nm. In that case, a short-channel effect of the transistor can be suppressed by using a CAAC oxide semiconductor layer as the oxide semiconductor layer 603(a), 603(b), 603(c), 603(d).

Dopants imparting n-type or p-type conductivity are added to the region 604a(c), 604b(c), 604a(d), 604b(d), and the region function as a source or a drain of the transistor. As the dopants, for example, one or more of elements of Group 13 in the periodic table (e.g., boron), elements of Group 15 in the periodic table (e.g., nitrogen, phosphorus, and arsenic), and rare gas elements (e.g., helium, argon, and xenon) can be used. A region functioning as a source of the transistor is also referred to as a source region, and a region functioning as a drain of the transistor is also referred to as a drain region. Since addition of the dopants to the region 604a(c), 604b(c), 604a(d), 604b(d) leads to a reduction in the contact resistance with the conductive layer, the transistor can be downsized.

The conductive layers 605a(a) to 605a(d) function of a source and a drain of the transistor, and the conductive layers 605b(a) and 605b(d) function as a source and a drain of the transistor. A layer functioning as a source of the transistor is also referred to as a source electrode or a source wiring, and a layer functioning as a drain of the transistor is also referred to as a drain electrode or a drain wiring.

As the conductive layer 605a(a), 605a(b), 605a(c), 605a(d), 605b(a), 605b(b), 605b(c), 605b(d), for example, a layer of a metal material such as aluminum, magnesium, chromium, copper, tantalum, titanium, molybdenum, or tungsten, or an alloy material which contains any of the above metal materials as a main component can be used. For example, the conductive layer 605a(a), 605a(b), 605a(c), 605a(d), 605b(a), 605b(b), 605b(c), 605b(d) can be formed using a layer of an alloy material containing copper, magnesium, and aluminum. The conductive layer 605a(a), 605a(b), 605a(c), 605a(d), 605b(a), 605b(b), 605b(c), 605b(d) can also be formed by stacking layers of materials which can be applied to the conductive layer 605a(a), 605a(b), 605a(c), 605a(d), 605b(a), 605b(b), 605b(c), 605b(d). For example, the conductive layer 605a(a), 605a(b), 605a(c), 605a(d), 605b(a), 605b(b), 605b(c), 605b(d) can be formed by stacking a layer of an alloy material containing copper, magnesium, and aluminum and a layer containing copper.

As the conductive layer 605a(a), 605a(b), 605a(c), 605a(d), 605b(a), 605b(b), 605b(c), 605b(d), a layer containing conductive metal oxide can also be used. Examples of the conductive metal oxide are indium oxide, tin oxide, zinc oxide, an oxide of indium and tin, and an oxide of indium and zinc. The conductive metal oxide applicable to the conductive layer 605a(a), 605a(b), 605a(c), 605a(d), 605b(a), 605b(b), 605b(c), 605b(d) may contain silicon oxide.

As the insulating layer 606(a), 606(b), a layer of a material that can be used for the insulating layer 602(a), 602(b), 602(c), 602(d) can be used. The insulating layer 606(a), 606(b) can be formed of stacked layers of materials that can be used for the insulating layer 606(a), 606(b). For example, the insulating layer 606(a), 606(b) may be formed of a silicon oxide layer, an aluminum oxide layer, or the like. For example, with application of an aluminum oxide layer to the insulating layer 606(a), 606(b), impurities (water) can be more prevented from entering the oxide semiconductor layer 603(a), 603(b) and effectively prevent oxygen can be more prevented from being eliminated from the oxide semiconductor layer 603(a), 603(b).

The conductive layer 608(a), 608(b) functions as a gate of the transistor. When the transistor includes both of the conductive layers 601(a) and 608(a) or both of the conductive layers 601(b) and 608(b), one of the conductive layers 601(a) and 608(a) or one of the conductive layers 601(b) and 608(b) is also referred to as a back gate, a back gate electrode, or a back gate wiring. In this manner, a plurality of conductive layers each functioning as a gate may be provided with the channel formation layer provided therebetween, whereby the threshold voltage of the transistor can be more easily controlled.

As the conductive layer 608(a), 608(b), a layer of a material that can be used for the conductive layer 601(a), 601(b), 601(c), 601(d) can be used, for example. The conductive layer 608(a), 608(b) may also be formed of stacked layers of materials that can be used for the conductive layer 608(a), 608(b).

Further, an insulating layer functioning as a channel protective layer may be formed of stacked layers of materials that can be used for the insulating layer 602(a), 602(b), 602(c), 602(d).

Further, a base layer may be formed over the element formation layer 600(a), 600(b), 600(c), 600(d), and the transistor may be formed over the base layer. In that case, a layer of a material that can be used for the insulating layer 602(a), 602(b), 602(c), 602(d) can be used as the base layer, for example. The base layer may also be formed of stacked layers of materials that can be used for the insulating layer 602(a), 602(b), 602(c), 602(d). For example, a base layer may be formed of a stack of an aluminum oxide layer and a silicon oxide layer, and thereby elimination of oxygen in the base layer through the oxide semiconductor layer 603(a), 603(b), 603(c), 603(d) can be suppressed.

Further, the insulating layer in contact with the oxide semiconductor layer 603(a), 603(b), 603(c), 603(d) may be formed to contain excess oxygen, whereby oxygen can be more easily supplied to the oxide semiconductor layer 603(a), 603(b), 603(c), 603(d). Accordingly, oxygen defects in the oxide semiconductor layer 603(a), 603(b), 603(c), 603(d) and in an interface between the insulating layer and the oxide semiconductor layer 603(a), 603(b), 603(c), 603(d) can be reduced; thus, the carrier density of the oxide semiconductor layer 603(a), 603(b), 603(c), 603(d) can be more reduced. One embodiment of the present invention is not limited thereto. The oxide semiconductor layer 603(a), 603(b), 603(c), 603(d) may be formed to contain excess oxygen in the manufacturing process, also in which case elimination of oxygen from the oxide semiconductor layer 603(a), 603(b), 603(c), 603(d) can be suppressed by the above-described insulating layer in contact with the oxide semiconductor layer 603(a), 603(b), 603(c), 603(d).

<Characteristics of Transistor Whose Channel is Formed in Oxide Semiconductor Layer>

In a transistor in which an oxide semiconductor containing. In, Sn, and Zn as its main components is used for a channel formation region, favorable characteristics can be provided by depositing the oxide semiconductor while heating a substrate or by performing heat treatment after an oxide semiconductor layer is formed. The "main component" means that the element is contained in composition at 5 atomic % or more.

By intentionally heating the substrate after formation of the oxide semiconductor layer containing In, Sn, and Zn as its main components, the field-effect mobility of the transistor can be improved. In addition, the threshold voltage of the transistor can be shifted in the positive direction to make the transistor normally off.

Figure 18A:
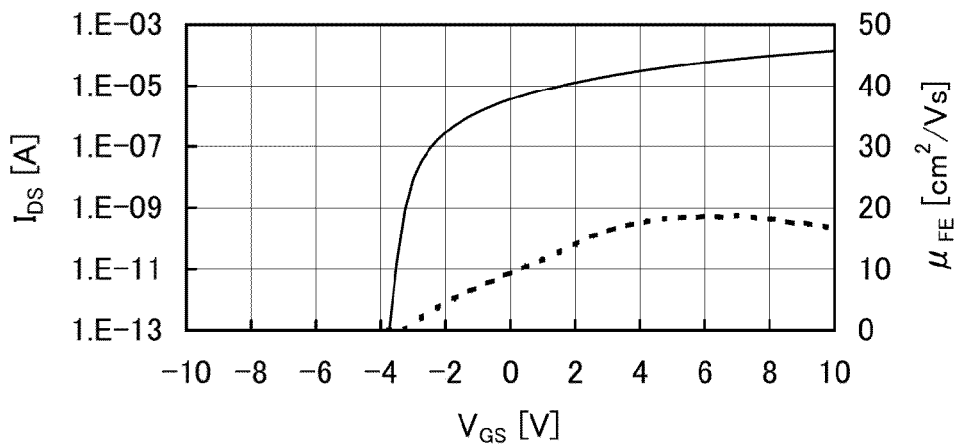
FIGS. 18A to 18C are graphs each showing characteristics of a transistor using an oxide semiconductor layer.
Figure 18B:
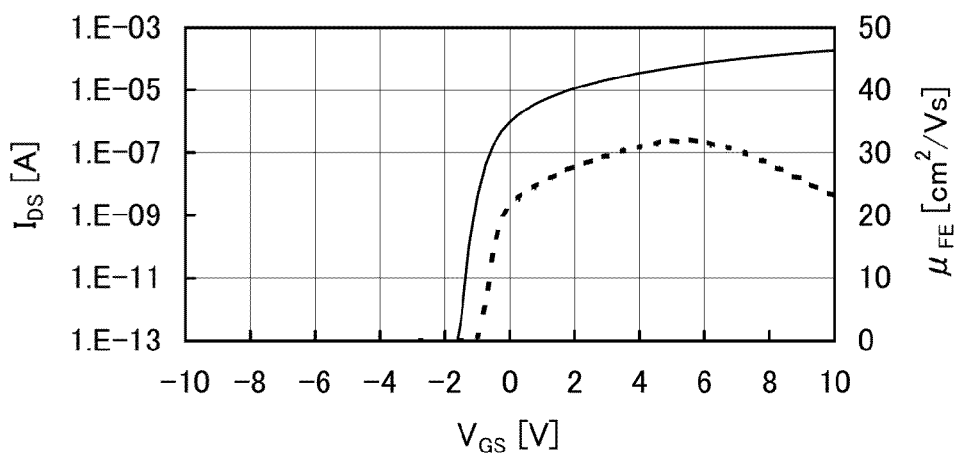
Figure 18C:
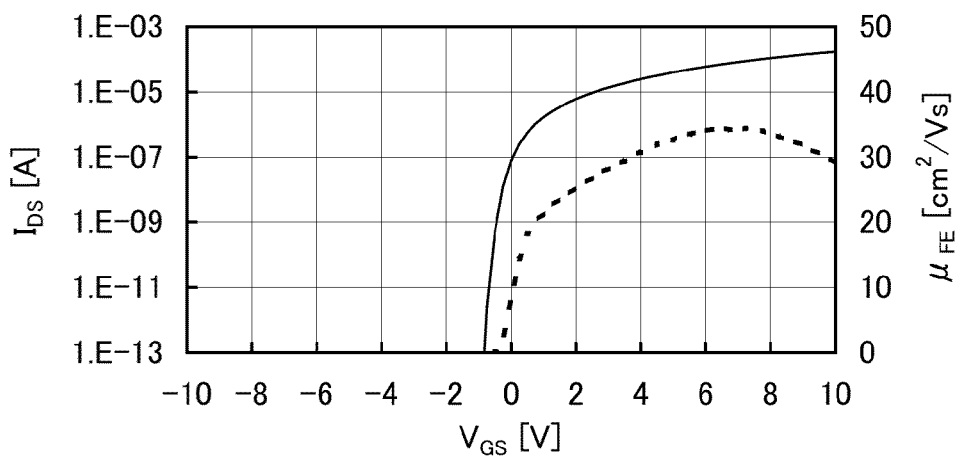

For example, FIGS. 18A to 18C each show characteristics of a transistor that includes an oxide semiconductor layer containing In, Sn, and Zn as its main components and having a channel length L of 3 μm and a channel width W of 10 μm, and a gate insulating layer with a thickness of 100 nm. Here, $V_d$ was set at 10 V.

FIG. 18A shows characteristics of a transistor whose oxide semiconductor layer containing In, Sn, and Zn as its main components was formed by a sputtering method without heating a substrate intentionally. The field-effect mobility of the transistor was 18.8 cm$^2$/Vsec. On the other hand, when the oxide semiconductor layer containing In, Sn, and Zn as its main components is formed while heating the substrate intentionally, the field-effect mobility can be improved. FIG. 18B shows characteristics of a transistor whose oxide semiconductor layer containing In, Sn, and Zn as its main components was formed while heating a substrate at 200° C. The field-effect mobility of the transistor was 32.2 cm$^2$/Vsec.

The field-effect mobility can be further enhanced by performing heat treatment after formation of the oxide semiconductor layer containing In, Sn, and Zn as its main components. FIG. 18C shows characteristics of a transistor whose oxide semiconductor layer containing In, Sn, and Zn as its main components was formed by sputtering at 200° C. and then subjected to heat treatment at 650° C. The field-effect mobility of the transistor was 34.5 cm$^2$/Vsec.

Such substrate heating or heat treatment acts such that hydrogen and a hydroxyl group, which are adverse impurities for an oxide semiconductor, are not included in the film or are removed from the film. That is, an oxide semiconductor can be highly purified by removing hydrogen serving as a donor impurity from the oxide semiconductor, which enables a transistor to be a normally-off transistor and enables the off-state current of the transistor to be reduced to 1 aA/μm or lower. Here, the off-state current is described per micrometer of channel width.

Figure 19:
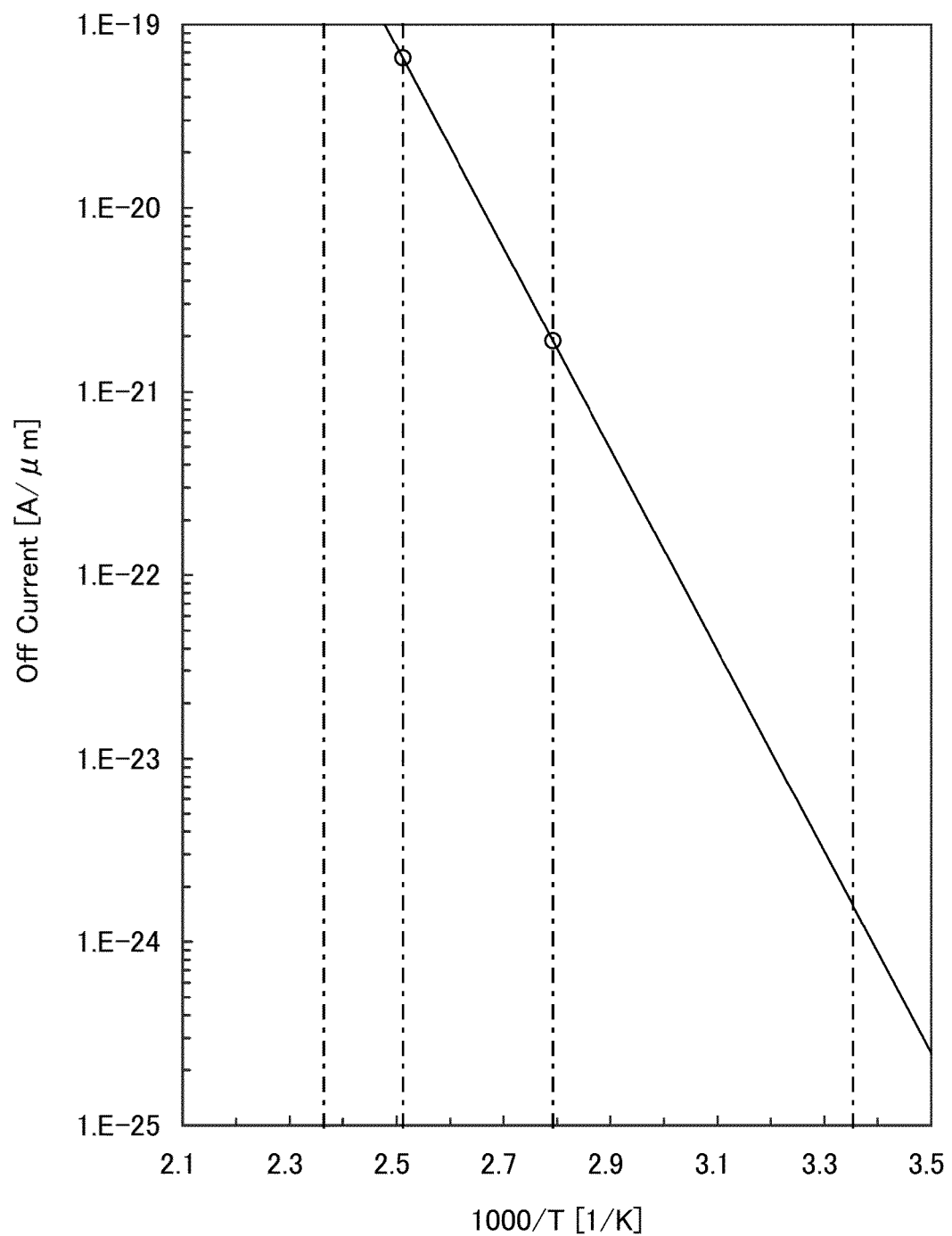
FIG. 19 is a graph showing a relation between off-state current and measuring substrate temperature of a transistor.

FIG. 19 shows a relation between the off-state current of a transistor and the inverse of substrate temperature (absolute temperature) at measurement. Here, for simplicity, a value (1000/T) obtained by multiplying the inverse of substrate temperature at measurement by 1000 is indicated in the horizontal axis.

As shown in FIG. 19, the off-state current was 0.1 aA/μm ($1 \times 10^{-19}$ A/μm) or smaller and 10 zA/μm ($1 \times 10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/mm ($1 \times 10^{-22}$ A/mm) or smaller. As is apparent from the above, the off-state current can be 1 aA/μm ($1 \times 10^{-18}$ A/mm) or smaller, 100 zA/μm ($1 \times 10^{-19}$ A/μm) or smaller, and 1 zA/μm ($1 \times 10^{-21}$ A/μm) or smaller at 125° C., 85° C., and room temperature, respectively.

The transistor described in this embodiment can be used for the semiconductor device described in Embodiment 1 or 2, whereby the semiconductor device can operate stably. In particular, by using the transistor described in this embodiment as the transistor 102, the off-state current of the transistor 102 can be reduced; accordingly, the amount of charge leaks from the capacitor 101 can be reduced, and thus the frequency of times of holding the offset voltage in the capacitor 101 can be reduced.

This embodiment can be implemented in appropriate combination with any other embodiment and the like.

Embodiment 6

In this embodiment, examples of an electronic device equipped with the semiconductor device, the shift register, the display device, or the like described in any of the above embodiments are described.

Figure 20A:
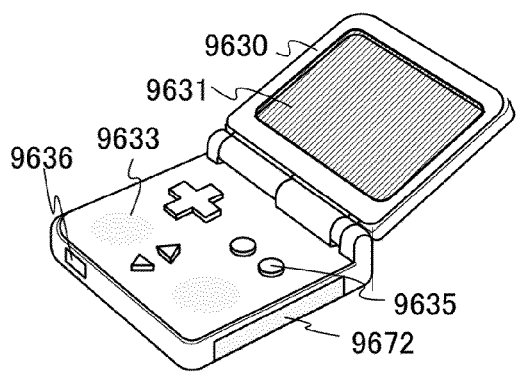
FIGS. 20A to 20D are views illustrating electronic devices according to embodiments of the present invention.

FIG. 20A shows a portable game console that includes a housing 9630, a display portion 9631, a speaker 9633, operation keys 9635, a connection terminal 9636, a recording medium reading portion 9672, and the like. The portable game console illustrated in FIG. 20A can have a function of reading a program or data stored in a recording medium to display on the display portion; a function of sharing data by wireless communication with another portable game console; or the like. The function of the portable game console illustrated in FIG. 20A is not limited thereto, and various functions can be provided.

Figure 20B:
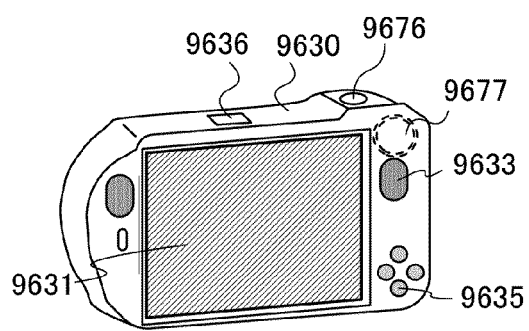

FIG. 20B illustrates a digital camera which includes a housing 9630, a display portion 9631, speakers 9633, operation keys 9635, a connection terminal 9636, a shutter button 9676, an image receiving portion 9677, and the like. The digital camera in FIG. 20B can have a function of taking a still image and/or a moving image, a function of automatically or manually correcting the taken image, a function of detecting various kinds of data from an antenna, a function of holding the taken image or the data detected from the antenna, a function of displaying the taken image or the data detected from the antenna on the display portion, and the like. The function of the digital camera illustrated in FIG. 20B is not limited thereto, and various functions can be provided.

Figure 20C:
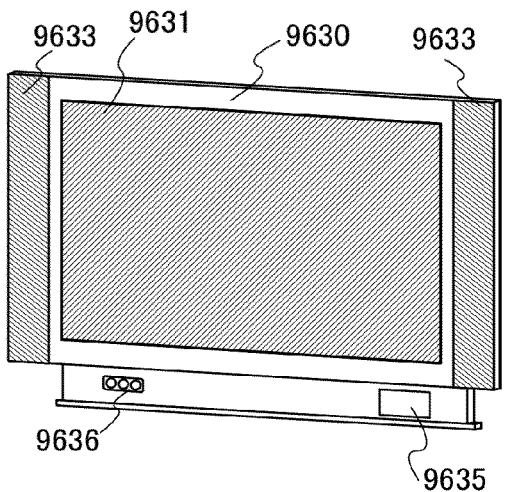

FIG. 20C illustrates a television set which includes a housing 9630, a display portion 9631, speakers 9633, operation keys 9635, a connection terminal 9636, and the like. The television set in FIG. 20C has a function of converting an electric wave for television into an image signal, a function of converting an image signal into a signal suitable for display, a function of converting the frame frequency of an image signal, and the like. The function of the television set illustrated in FIG. 20C is not limited thereto, and various functions can be provided.

Figure 20D:
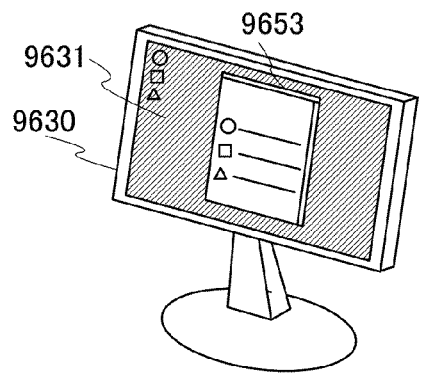

FIG. 20D illustrates a monitor for electronic computers (personal computer) (the monitor is also referred to as a PC monitor) that includes a housing 9630, a display portion 9631, and the like. As an example, in the monitor in FIG. 20D, a window-type display portion 9653 is provided for the display portion 9631. Note that FIG. 20D illustrates the window-type display portion 9653 in the display portion 9631 for explanation; another symbol such as an icon or an image may be displayed. In the monitor for a personal computer, an image signal is rewritten only at the time of data inputting in many cases, which is preferable to apply the method for driving a display device in the above-described embodiment. The function of the monitor illustrated in FIG. 20D is not limited thereto, and various functions can be provided.

Figure 21A:
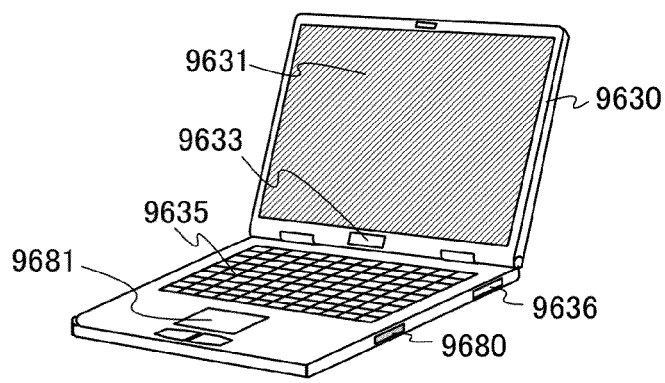
FIGS. 21A to 21D are views illustrating electronic devices according to embodiments of the present invention.

FIG. 21A illustrates a computer that includes a housing 9630, a display portion 9631, a speaker 9633, operation keys 9635, a connection terminal 9636, a pointing device 9681, an external connection port 9680, and the like. The computer illustrated in FIG. 21A can have a function of displaying various kinds of data (e.g., a still image, a moving image, and a text image) on the display portion; a function of controlling processing by various kinds of software (programs); a communication function such as wireless communication or wire communication; a function of connecting with various computer networks by using communication function; a function of transmitting or receiving various kinds of data by using communication function; or the like. The function of the computer illustrated in FIG. 21A is not limited thereto, and various functions can be provided.

Figure 21B:
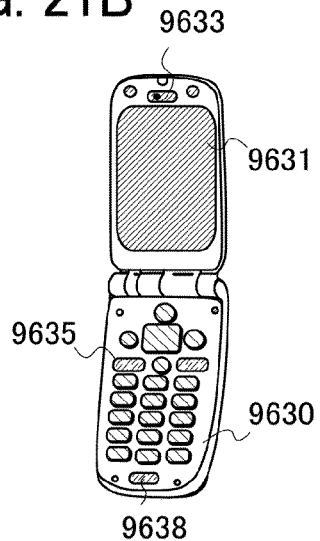

FIG. 21B illustrates a mobile phone that includes a housing 9630, a display portion 9631, a speaker 9633, operation keys 9635, a microphone 9638, and the like. The mobile phone illustrated in FIG. 21B can have a function of displaying a variety of data (e.g., a still image, a moving image, and a text image) on the display portion; a function of displaying a calendar, date, the time, and the like on the display portion; a function of operating or editing data displayed on the display portion; a function of controlling processing by various kinds of software (programs); or the like. The function of the mobile phone illustrated in FIG. 21B is not limited thereto, and various functions can be provided.

Figure 21C:
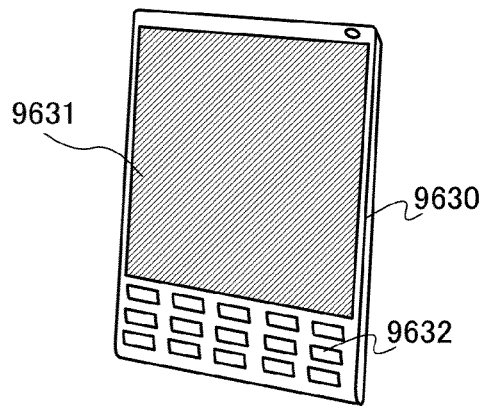
Figure 21D:
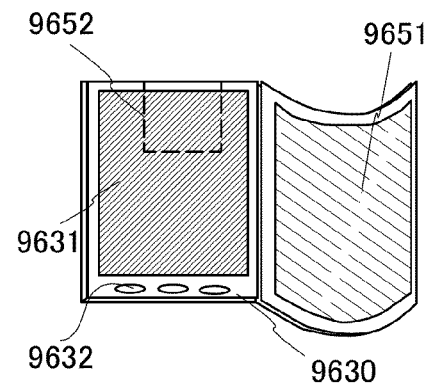

FIG. 21C illustrates electronic paper (also referred to as an e-book or an e-book reader) that includes a housing 9630, a display portion 9631, operation keys 9632, and the like. The electronic paper illustrated in FIG. 21C has a function of displaying various kinds of data (e.g., a still image, a moving image, and a text image) on the display portion, a function of displaying a calendar, a date, the time, or the like on the display portion, a function of operating or editing data displayed on the display portion, a function of controlling processing by various kinds of software (programs), or the like. The function of the electronic paper illustrated in FIG. 21C is not limited thereto, and various functions can be provided. FIG. 21D illustrates another electronic paper. The electronic paper in FIG. 21D has a structure in which a solar battery 9651 and a battery 9652 are added to the electronic paper in FIG. 21C. When a reflective display device is used as the display portion 9631, the electronic paper is expected to be used in a comparatively bright environment, in which case the structure in FIG. 21D is preferable because the solar battery 9651 can efficiently generate power and the battery 9652 can efficiently charge power. Note that it is advantageous to use a lithium ion battery as the battery 9652 in a reduction in size or the like.

The semiconductor device described in Embodiment 1, the semiconductor device described in Embodiment 2, the shift register described in Embodiment 3, or the display device described in Embodiment 4 can be applied to any electronic device described in this embodiment, whereby the electronic device can operate even when a transistor thereof is a depletion transistor.

This embodiment can be implemented in appropriate combination with any structure described in any other embodiment.

This application is based on Japanese Patent Application serial no. 2011-108133 filed with Japan Patent Office on May 13, 2011, the entire contents of which are hereby incorporated by reference.

What is claimed is:

1. A driving method of a semiconductor device which comprises:
    a first circuit comprising a capacitor and a first transistor; and
    a second circuit comprising a second transistor,
    wherein a gate of the second transistor is connected to the first circuit,
    wherein the first transistor has a same conductivity type as the second transistor,
    the driving method comprising the steps of:
        supplying a first potential to a first electrode of the capacitor;
        supplying a second potential to a second electrode of the capacitor through the first transistor, wherein the second potential is lower than the first potential; and
        making the second electrode of the capacitor into a floating state,
    wherein a potential supplied to a first terminal of the second transistor and a potential supplied to a second terminal of the second transistor are distinct from the second potential.

2. The driving method according to claim 1,
    wherein an offset voltage is held in the capacitor, and
    wherein a signal in accordance with the offset voltage is input to the gate of the second transistor.

3. The driving method according to claim 1, wherein at least one of the first transistor and the second transistor comprises an oxide semiconductor.

4. The driving method according to claim 1, wherein the second circuit further comprises a third transistor, a fourth transistor, and a fifth transistor each having the same conductivity type as the second transistor.

5. The driving method according to claim 1, wherein the second potential is lower than the potential supplied to the first terminal of the second transistor.

6. A driving method of a semiconductor device which comprises:
    a capacitor;

a first transistor; and
a second transistor,
wherein a first electrode of the capacitor is connected to a first wiring,
wherein a first terminal of the first transistor is connected to a second wiring,
wherein a second electrode of the capacitor, a second terminal of the first transistor, and a gate of the second transistor are connected to each other,
wherein the first transistor has a same conductivity type as the second transistor,
the driving method comprising the steps of:
  supplying a first potential to the first electrode of the capacitor;
  turning on the first transistor so that a second potential is supplied to the second electrode of the capacitor through the first transistor; and
  turning off the first transistor so that the second electrode of the capacitor is made into a floating state,
wherein a potential supplied to a first terminal of the second transistor and a potential supplied to a second terminal of the second transistor are distinct from the second potential.

7. The driving method according to claim 6,
wherein an offset voltage is held in the capacitor, and
wherein a signal in accordance with the offset voltage is input to the gate of the second transistor.

8. The driving method according to claim 6, wherein at least one of the first transistor and the second transistor comprises an oxide semiconductor.

9. The driving method according to claim 6, wherein the semiconductor device further comprises a third transistor, a fourth transistor, and a fifth transistor each having the same conductivity type as the second transistor.

10. The driving method according to claim 6, wherein the second potential is lower than the potential supplied to the first terminal of the second transistor.

11. A driving method of a semiconductor device which comprises:
  capacitor;
  a first transistor; and
  a second transistor,
wherein a first electrode of the capacitor is connected to a first wiring,
wherein a first terminal of the first transistor is connected to a second wiring,
wherein a second electrode of the capacitor, a second terminal of the first transistor, and a gate of the second transistor are connected to each other,
wherein the first transistor has a same conductivity type as the second transistor,
the driving method comprising the steps of:
  in a period during which an offset voltage is held in the capacitor,
  supplying a first potential to the first electrode of the capacitor; and
  turning on the first transistor so that a second potential is supplied to the second electrode of the capacitor through the first transistor,
  in a period during which a signal in accordance with the offset voltage is output from the capacitor,
  turning off the first transistor so that the second electrode of the capacitor is made into a floating state; and
  outputting the signal in accordance with the offset voltage from the capacitor to the gate of the second transistor,
wherein a potential supplied to a first terminal of the second transistor and a potential supplied to a second terminal of the second transistor are distinct from the second potential.

12. The driving method according to claim 11, wherein at least one of the first transistor and the second transistor comprises an oxide semiconductor.

13. The driving method according to claim 11, wherein the semiconductor device further comprises a third transistor, a fourth transistor, and a fifth transistor each having the same conductivity type as the second transistor.

14. The driving method according to claim 11, wherein the second potential is lower than the potential supplied to the first terminal of the second transistor.

* * * * *